United States Patent
Davis et al.

(10) Patent No.: US 10,338,135 B2
(45) Date of Patent: Jul. 2, 2019

(54) EXTRACTING DEBUG INFORMATION FROM FPGAS IN MULTI-TENANT ENVIRONMENTS

(71) Applicant: Amazon Technologies, Inc., Seattle, WA (US)

(72) Inventors: Mark Bradley Davis, Austin, TX (US); Christopher Joseph Pettey, Woodinville, WA (US); Asif Khan, Cedar Park, TX (US); Islam Mohamed Hatem Abdulfattah Mohamed Atta, Vancouver (CA)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/279,276

(22) Filed: Sep. 28, 2016

(65) Prior Publication Data
US 2018/0088174 A1    Mar. 29, 2018

(51) Int. Cl.
*G06F 11/00* (2006.01)
*G01R 31/317* (2006.01)
(Continued)

(52) U.S. Cl.
CPC ... *G01R 31/31705* (2013.01); *G01R 31/2884* (2013.01); *G01R 31/3172* (2013.01);
(Continued)

(58) Field of Classification Search
CPC .......... G01R 31/31705; G01R 31/2884; G01R 31/3172; G01R 31/3177
See application file for complete search history.

(56) References Cited

U.S. PATENT DOCUMENTS 6,011,407 A    1/2000 New
6,785,816 B1   8/2004 Kivimaki et al.
(Continued)

FOREIGN PATENT DOCUMENTS

WO   WO 2002/01425    1/2002
WO   WO 2013/158707   10/2013
WO   WO 2015/042684   4/2015

OTHER PUBLICATIONS

Byma et al., "FPGAs in the Cloud: Booting Virtualized Hardware Accelerators with OpenStack," 2014 IEEE 22nd Annual International Symposium on Field-Programmable Custom Computing Machines, May 2014, pp. 109-116.
(Continued)

*Primary Examiner* — Esaw T Abraham
(74) *Attorney, Agent, or Firm* — Klarquist Sparkman, LLP

(57) ABSTRACT

Methods and apparatus are disclosed for programming reconfigurable logic devices such as FPGAs in a multi-tenant server environment. In one example, a computing host includes one or more processors configured to execute a supervisor process and two or more user processes and a single FPGA integrated circuit configured into a plurality of partitions. The partitions include a host logic partition that is accessible only to the supervisor process executing on the computing host, and two or more accelerator partitions. Each of the accelerator partitions is configured to include a virtual debug unit with a logic analyzer that collects logic signals generated by logic within the respective accelerator partition and sends debug data indicating values of the logic signals to one of the user processes. In some examples, the host logic partitions and/or the accelerator partitions can be independently reprogrammed of each other within their respective portions of the single FPGA.

27 Claims, 10 Drawing Sheets

(51) Int. Cl.
*G01R 31/28* (2006.01)
*G01R 31/3177* (2006.01)
*G06F 11/36* (2006.01)
*G06F 9/50* (2006.01)

(52) U.S. Cl.
CPC ...... *G01R 31/3177* (2013.01); *G06F 11/3656* (2013.01); *G06F 9/5044* (2013.01)

(56) References Cited

U.S. PATENT DOCUMENTS

| | | | |
|---|---|---|---|
| 6,802,026 B1* | 10/2004 | Patterson | G06F 11/362 712/227 |
| 6,826,717 B1* | 11/2004 | Draper | G01R 31/31725 714/39 |
| 7,716,497 B1 | 5/2010 | Timberger | |
| 7,739,092 B1* | 6/2010 | Ballagh | G06F 17/5027 703/13 |
| 8,145,894 B1 | 3/2012 | Casselman | |
| 8,516,272 B2 | 8/2013 | Hofstee et al. | |
| 8,621,597 B1 | 12/2013 | Jenkins, IV | |
| 9,038,072 B2* | 5/2015 | Nollet | G06F 15/7867 713/100 |
| 9,098,662 B1* | 8/2015 | Chiu | G06F 17/5045 |
| 9,141,747 B1* | 9/2015 | Orthner | H03K 19/003 |
| 9,298,865 B1* | 3/2016 | Peng | G06F 17/5022 |
| 9,483,639 B2* | 11/2016 | Sliwa | G06F 9/5077 |
| 9,684,743 B2* | 6/2017 | Larzul | G06F 17/5009 |
| 2004/0236556 A1 | 11/2004 | Lin | |
| 2008/0028186 A1 | 1/2008 | Casselman | |
| 2011/0047546 A1 | 2/2011 | Kivity et al. | |
| 2013/0145431 A1 | 6/2013 | Kruglick | |
| 2014/0351811 A1 | 11/2014 | Kruglick | |
| 2014/0380025 A1 | 12/2014 | Kruglick | |
| 2015/0227662 A1 | 8/2015 | Lepercq | |
| 2016/0034295 A1 | 2/2016 | Cochran | |
| 2016/0285628 A1 | 9/2016 | Carrer et al. | |
| 2017/0187831 A1 | 6/2017 | Otting et al. | |
| 2018/0034793 A1 | 2/2018 | Kibalo et al. | |
| 2018/0075231 A1 | 3/2018 | Subramanian et al. | |
| 2018/0077144 A1 | 3/2018 | Gangawane et al. | |
| 2018/0088992 A1 | 3/2018 | Davis et al. | |
| 2018/0089119 A1 | 3/2018 | Khan et al. | |
| 2018/0089343 A1 | 3/2018 | Atta | |
| 2018/0091484 A1 | 3/2018 | Atta et al. | |
| 2018/0095670 A1 | 4/2018 | Davis et al. | |
| 2018/0095774 A1 | 4/2018 | Atta et al. | |

OTHER PUBLICATIONS

"ChipScope Pro Software and Cores User Guide," Xilinx, Inc., Oct. 16, 2012, 226 pages.

"PlanAhead Tutorial Debugging with ChipScope," Xilinx, Inc., Jul. 25, 2012, 22 pages.

"SDAccel Development Environment User Guide," Xilinx, Inc., © 2016, 85 pages.

"The Xilinx SDAccel Development Environment Bringing the Best Performance/Watt to the Data Center," Xilinx, Inc., © 2014, 6 pages.

Chen et al., "Enabling FPGAs in the Cloud," Proceedings of the 11$^{th}$ ACM Conference on Computing Frontiers, May 2014, pp. 1-10.

Eslami et al., "Enabling Effective FPGA Debug Using Overlays: Opportunities and Challenges," 2$^{nd}$ International Workshop on Overlay Architectures for FPGAs, Jun. 2016, pp. 1-6.

International Search Report and Written Opinion for PCT/US2017/054171, dated Dec. 22, 2017, pp. 1-17.

Weerasinghe et al., "Enabling FPGAs in Hyperscale Data Centers," 2015 IEEE 12$^{th}$ International Conference on Ubiquitous Intelligence and Computing, 2015 IEEE 12$^{th}$ International Conference on Autonomic and Trusted Computing, and 2015 IEEE 15$^{th}$ Conference on Scalable Computing and Communications and ITS Associated Workshops, Aug. 2015, pp. 1078-1086.

Eguro et al., "FPGAs for trusted cloud computing," 2012 22nd International Conference on Field Programmable Logic and Applications, Aug. 2012, pp. 63-70.

Fahmy et al., "Virtualized FPGA Accelerators for Efficient Cloud Computing," 2015 IEEE 7th International Conference on Cloud Computing Technology and Science, 2015, pp. 430-435.

Hutchings et al., "Implementation Approaches for Reconfigurable Logic Application," Proceedings of the 5th International Workshop on Field Programmable Logic and Applications, Aug.-Sep. 1995, pp. 419-428.

"SDAccel Development Environment," Xilinx, Inc., document downloaded from http://www.xilinx.com/products/design-tools/software-zone/sdaccel.html on Jul. 25, 2016, 9 pages.

Zazo et al., "A PCIe DMA engine to support the virtualization of 40 Gbps FPGA-accelerated network appliances," 2015 IEEE International Conference on Reconfigurable Computing and FPGAS, Dec. 2015, pp. 1-6.

* cited by examiner

EXTRACTING DEBUG INFORMATION FROM FPGAS IN MULTI-TENANT ENVIRONMENTS

BACKGROUND

Cloud computing is the use of computing resources (hardware and software) which are available in a remote location and accessible over a network, such as the Internet. In some arrangements, users are able to buy these computing resources (including storage and computing power) as a utility on demand service. Cloud computing entrusts remote services with a user's data, software and computation. Use of virtual computing resources can provide a number of advantages including cost advantages and/or the ability to adapt rapidly to changing computing resource needs.

Some computations can be accelerated through the use of a co-processor, including accelerators implemented with reconfigurable logic (e.g., in a Field Programmable Gate Array (FPGA). FPGA developers typically connect a local host computer with a specialized interface to external pins of a local FPGA supporting a JTAG interface in order to obtain debug information, such as internal signal state values. Debugging such accelerators in a cloud computing environment, which lack specialized hardware and security features, thus presents ample opportunity for improvement.

DETAILED DESCRIPTION

Figure 1:
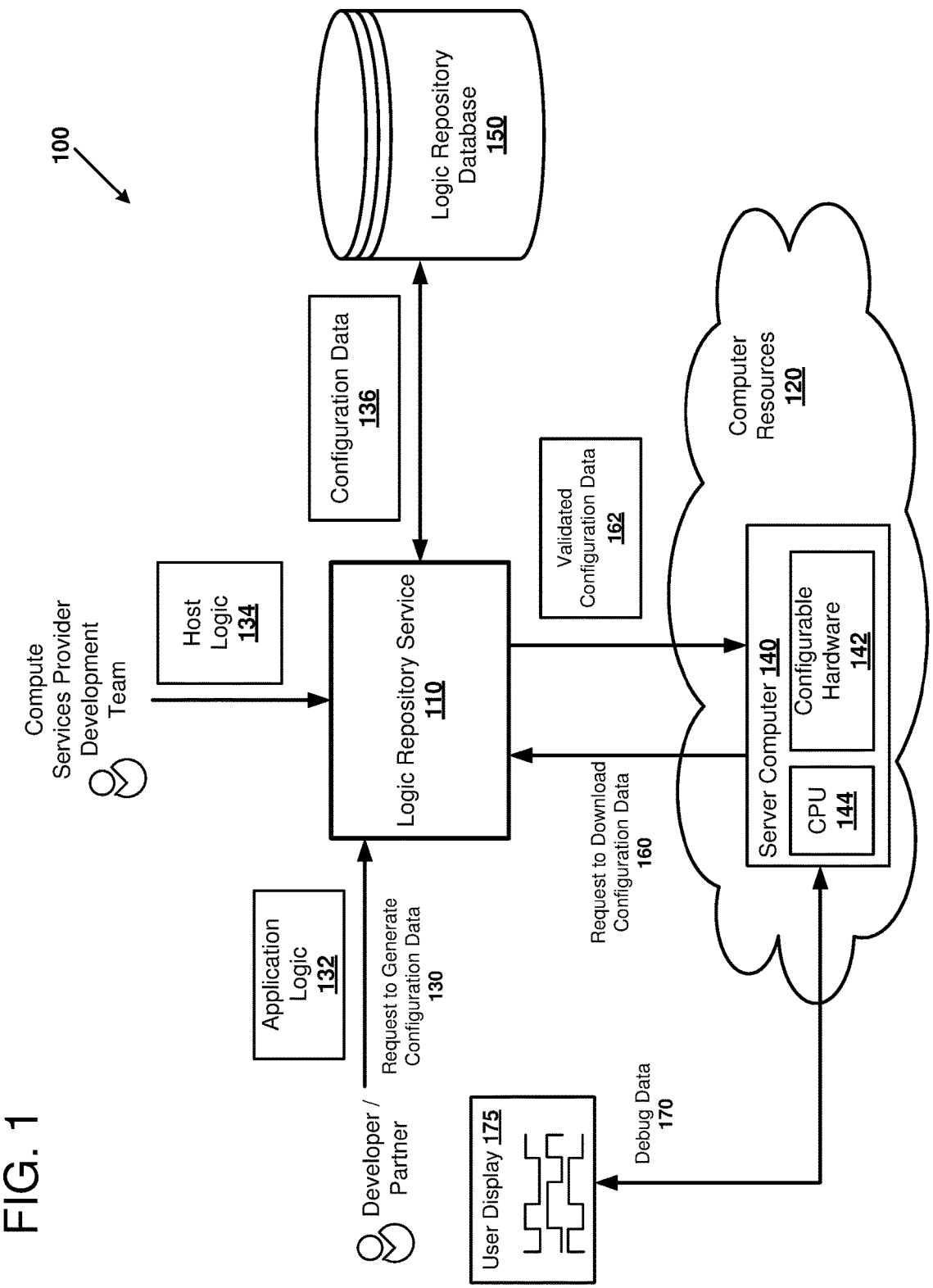
FIG. 1 is a system diagram showing an example of a system including a logic repository service for managing configuration data and viewing debug data, as can be implemented in certain examples of the disclosed technology.

One solution for providing specialized computing resources within a set of reusable general computing resources is to provide a server computer comprising a configurable logic platform (such as by providing a server computer with an add-in card including a field-programmable gate array (FPGA)) as a choice among the general computing resources. Configurable logic is hardware that can be programmed or configured to perform a logic function that is specified by configuration data that is applied to the configurable logic. For example, a user of the computing resources can provide a specification (e.g., written in a hardware description language (e.g., Verilog, SystemVerilog, and/or VHDL) or other language (e.g., C, C++, and/or SystemC), in a netlist generated with a schematic capture application, or in a netlist generated by a script) for configuring the configurable logic. The configurable logic can be configured according to the specification, and the configured logic can be used to perform a task for the user. However, allowing a user access to low-level hardware of the computing facility can potentially introduce security and privacy issues within the computing facility.

As described herein, a compute services facility can include a variety of computing resources, where one type of the computing resources can include a server computer (alternatively dubbed a host computer) comprising a configurable logic platform. The configurable logic platform can be programmed or configured by a user of the computer system so that hardware (e.g., the configurable logic) of the computing resource is customized by the user. For example, the user can program the configurable logic so that it functions as a hardware accelerator that is tightly coupled to the server computer. For example, the hardware accelerator can be accessible via a local interconnect, such as a Peripheral Component Interconnect Express (PCI-Express or PCIe) or an IEEE 802.3 (Ethernet) connection, of the server computer. The user can execute an application on the server computer and tasks of the application can be performed by the hardware accelerator using PCIe transactions. By tightly coupling the hardware accelerator to the server computer, the latency between the accelerator and the server computer can be reduced which can potentially increase the processing speed of the application.

The compute services provider can manage the computing resources using software services to manage the configuration and operation of the configurable hardware. As one example, the compute service provider can execute a logic repository service for ingesting a hardware or logic design of a user, generating validated configuration data for configuring the configurable logic platform based on the logic design of the user, and downloading the validated configuration data in response to a request to configure an instance of the configurable logic platform. The configuration data can include data for creating debugging resources on the configurable logic platform, allowing for viewing of signal values, triggers that indicate the occurrence of event, performance counters, and other suitable debugging technology for monitoring reconfigurable logic devices. The download request can be from the user that developed the logic design or from a user that has acquired a license to use the logic design. Thus, logic designs can be created by the compute services provider, a user, or a third-party separate from the user or the compute services provider. For example, a marketplace of accelerator intellectual property (IP) can be provided to the users of the compute services provider, and the users can potentially increase the speed of their applications by selecting an accelerator from the marketplace.

FIG. 1 is a system diagram showing an example of a system 100 including a logic repository service 110 for managing configuration data that can be used to configure configurable resources within compute resources 120. In particular, the logic repository service 110 can be used for ingesting host and application logic into an infrastructure of a compute services provider, generating configuration data based on the ingested designs, maintaining a repository of the ingested designs and the generated configuration data, and providing configuration data for the configurable compute resources when the resources are deployed.

The logic repository service 110 can be a network-accessible service, such as a web service. Web services are commonly used in cloud computing. A web service is a software function provided at a network address over the web or the cloud. Clients initiate web service requests to servers and servers process the requests and return appropriate responses. The client web service requests are typically initiated using, for example, an API request. For purposes of simplicity, web service requests will be generally described below as API requests, but it is understood that other web service requests can be made. An API request is a programmatic interface to a defined request-response message system, typically expressed in JSON or XML, which is exposed via the web—most commonly by means of an HTTP-based web server. Thus, in certain implementations, an API can be defined as a set of Hypertext Transfer Protocol (HTTP) request messages, along with a definition of the structure of response messages, which can be in an Extensible Markup Language (XML) or JavaScript Object Notation (JSON) format. The API can specify a set of functions or routines that perform an action, which includes accomplishing a specific task or allowing interaction with a software component. When a web service receives the API request from a client device, the web service can generate a response to the request and send the response to the endpoint identified in the request. Additionally or alternatively, the web service can perform actions in response to the API request without generating a response to the endpoint identified in the request.

The logic repository service 110 can receive an API request 130 to generate configuration data for a configurable hardware platform, such as configurable hardware 142 of a server computer 140. Typically, the configurable hardware 142 includes reprogrammable logic devices, such as Field Programmable Gate Arrays (FPGAs), configurable programmable logic devices (CPLDs), programmable logic devices (PLDs), and programmable memory resources (e.g., electrically erasable programmable read only memory (EEPROM) or flash memory). In some examples, some or all of the configurable hardware is one-time programmable. In some examples, functionality for the logic repository service 110 is implemented in whole or in part using the server computer 140, while in other examples, the functionality is implemented with computer resources separate from the server computer.

The API request 130 can be originated by a developer or partner user of the compute services provider. The request 130 can include fields for specifying data and/or metadata about the logic design, the configurable hardware platform, user information, access privileges, production status, and various additional fields for describing information about the inputs, outputs, and users of the logic repository service 110. As specific examples, the request can include a description of the design, a production status (such as trial or production), an encrypted status of the input or output of the service, a reference to a location for storing an input file (such as the hardware design source code), a type of the input file, an instance type of the configurable hardware, and a reference to a location for storing an output file or report.

In particular, the request can include a reference to a hardware design specifying application logic 132 for implementation on the configurable hardware platform. Host logic 134, which will be used to control operation of the application logic when programmed into the configurable hardware, is received from, for example, a compute services provider development team. A specification of the application logic 132 and/or of the host logic 134 can be a collection of files, such as source code, a netlist generated by a logic synthesis tool, and/or placed and routed logic gates generated by a place and route tool. The source code can include code written in a hardware description language (HDL), a register transfer logic (RTL) language, or a high-level language such as Open Computing Language (OpenCL) or C.

The compute resources 120 can include many different types of hardware and software categorized by instance type. In particular, an instance type specifies at least a portion of the hardware and software of a resource. For example, hardware resources can include servers with central processing units (CPUs) of varying performance levels (e.g., different clock speeds, architectures, cache sizes, and so forth), servers with and without co-processors (such as graphics processing units (GPUs) and configurable logic), servers with varying capacity and performance of memory and/or local storage, and servers with different networking performance levels. Example software resources can include different operating systems, application programs, and drivers. One example instance type can comprise the server computer 140 including a central processing unit (CPU) 144 in communication with the configurable hardware 142. The configurable hardware 142 can include programmable logic such as an FPGA, a programmable logic array (PLA), a programmable array logic (PAL), a generic array logic (GAL), or a complex programmable logic device (CPLD), for example.

The logic repository service 110 can generate configuration data 136 in response to receiving the API request 130. The generated configuration data 136 can be based on the application logic 132 and the host logic 134. Specifically, the generated configuration data 136 can include information that can be used to program or configure the configurable hardware 142 so that it performs the functions specified by the application logic 132 and the host logic 134. As one example, the compute services provider can generate the host logic 134 including logic for interfacing between the CPU 144 and the configurable hardware 142. In some examples, the host logic 134 can include logic for masking or shielding the application logic 132, including any of its included debugging functionality, from communicating directly with the CPU 144 so that all CPU-application logic transactions pass through the host logic 134. In this manner, the host logic 134 can potentially reduce security and availability risks that could be introduced by the application logic 132. In other examples, the application logic 132 can communicate directly to the CPU 144 via an interface, such as PCIe, Ethernet, Infiniband, or other suitable interface.

Generating the configuration data 136 can include performing checks and/or tests on the application logic 132, integrating the application logic 132 into a host logic 134 wrapper, synthesizing the application logic 132, and/or placing and routing the application logic 132.

Generating the configuration data 136 can include compiling and/or translating source code of the application logic 132 and the host logic 134 into data that can be used to program or configure the configurable hardware 142. For example, the logic repository service 110 can integrate the application logic 132 into a host logic 134 wrapper. Specifically, the application logic 132 can be instantiated in a system design that includes the application logic 132 and the host logic 134. The integrated system design can synthesized, using a logic synthesis program, to create a netlist for the system design. The netlist can be placed and routed, using a place and route program, for the instance type specified for the system design. The placed and routed design can be converted to configuration data 136 which can be used to program the configurable hardware 142. For example, the configuration data 136 can be directly output from the place and route program.

As one example, the generated configuration data 136 can include a complete or partial bitstream for configuring all or a portion of the configurable logic of an FPGA. An FPGA can include configurable logic and non-configurable logic. The configurable logic can include programmable logic blocks comprising combinational logic and/or look-up tables (LUTs) and sequential logic elements (such as flip-flops and/or latches), programmable routing and clocking resources, programmable distributed and block random access memories (RAMs), digital signal processing (DSP) bitslices, and programmable input/output pins. A configuration access port of the FPGA can be used to load configuration data encoded in a bitstream into FPGA configuration memory. In other examples, the FPGA is programmed to include an internal configuration access port used to load configuration data. The values loaded within the on-chip memories can be used to control the configurable logic so that the configurable logic performs the logic functions that are specified by the bitstream. Additionally, the configurable logic can be divided into different partitions or regions which can be configured independently of one another. As one example, a full bitstream can be used to configure the configurable logic across all of the regions and a partial bitstream can be used to configure only a portion of the configurable logic regions. For example, individual partial bitstreams for each of a host logic portion, a first application logic portion, a second application logic portion, etc., can be generated, downloaded to a configurable hardware platform, and used to independently program different portions of a single FPGA. Because the partial bitstreams can be applied independently, detailed knowledge of other portions of the FPGA need not be made available to others, thereby protecting user privacy. In some examples, some or all of the bitstreams can be further protected using encryption. The non-configurable logic can include hard macros that perform a specific function within the FPGA, such as input/output blocks (e.g., serializer and deserializer (SERDES) blocks and gigabit transceivers), analog-to-digital converters, memory control blocks, test access ports, and configuration logic for loading the configuration data onto the configurable logic.

The logic repository service 110 can store the generated configuration data 136 in a logic repository database 150. The logic repository database 150 can be stored on removable or non-removable media, including magnetic disks, direct-attached storage, network-attached storage (NAS), storage area networks (SAN), redundant arrays of independent disks (RAID), magnetic tapes or cassettes, CD-ROMs, DVDs, or any other medium which can be used to store information in a non-transitory way and which can be accessed by the logic repository service 110. Additionally, the logic repository service 110 can be used to store input files (such as the specifications for the application logic 132 and the host logic 134) and metadata about the logic designs and/or the users of the logic repository service 110. The generated configuration data 136 can be indexed by one or more properties such as a user identifier, an instance type or types, a marketplace identifier, a machine image identifier, and a configurable hardware identifier, for example.

The logic repository service 110 can receive an API request 160 to download configuration data. For example, the request 160 can be generated when a user of the compute resources 120 launches or deploys a new instance (e.g., an "F1.small" instance) within the compute resources 120. As another example, the request 160 can be generated in response to a request from an application executing on an operating instance. The request 160 can include a reference to the source and/or destination instance, a reference to the configuration data to download (e.g., an instance type, a marketplace identifier, a machine image identifier, or a configurable hardware identifier), a user identifier, an authorization token, and/or other information for identifying the configuration data to download and/or authorizing access to the configuration data. If the user requesting the configuration data is authorized to access the configuration data, the configuration data can be retrieved from the logic repository database 150, and validated configuration data 162 (e.g. a full or partial bitstream) can be downloaded to the requesting instance (e.g., server computer 140). The validated configuration data 162 can be used to configure the configurable logic of the destination instance.

The logic repository service 110 can verify that the validated configuration data 162 can be downloaded to the requesting instance. Validation can occur at multiple different points by the logic repository service 110. For example, validation can include verifying that the application logic 132 is compatible with the host logic 134. In particular, a regression suite of tests can be executed on a simulator to verify that the host logic 134 performs as expected after the application logic 132 is added to the design. Additionally or alternatively, it can be verified that the application logic 132 is specified to reside only in reconfigurable regions that are separate from reconfigurable regions of the host logic 134. As another example, validation can include verifying that the validated configuration data 162 is compatible with the instance type to download to. As another example, validation can include verifying that the requestor is authorized to access the validated configuration data 162. If any of the validation checks fail, the logic repository service 110 can deny the request to download the validated configuration data 162. Thus, the logic repository service 110 can potentially safeguard the security and the availability of the computing resources 120 while enabling a user to customize hardware of the computing resources 120.

Once the configurable hardware 142 has been configured with the validated configuration data 162, debug data 170 (e.g., signal values, event counter values, or memory values) can be received from the server computer. For examples, received signal values can be used to generate waveforms on a display 175 for aiding debugging. As another example, debug data can be sent to the server computer 140 to force state values in the reconfigurable logic to certain values or reset event counters)

As stated above, in some examples, operations described above for the logic repository service 110 can be performed using the server computer 140, using other resources within the compute resources 120, or using other resources besides the compute resources 120.

Figure 2:
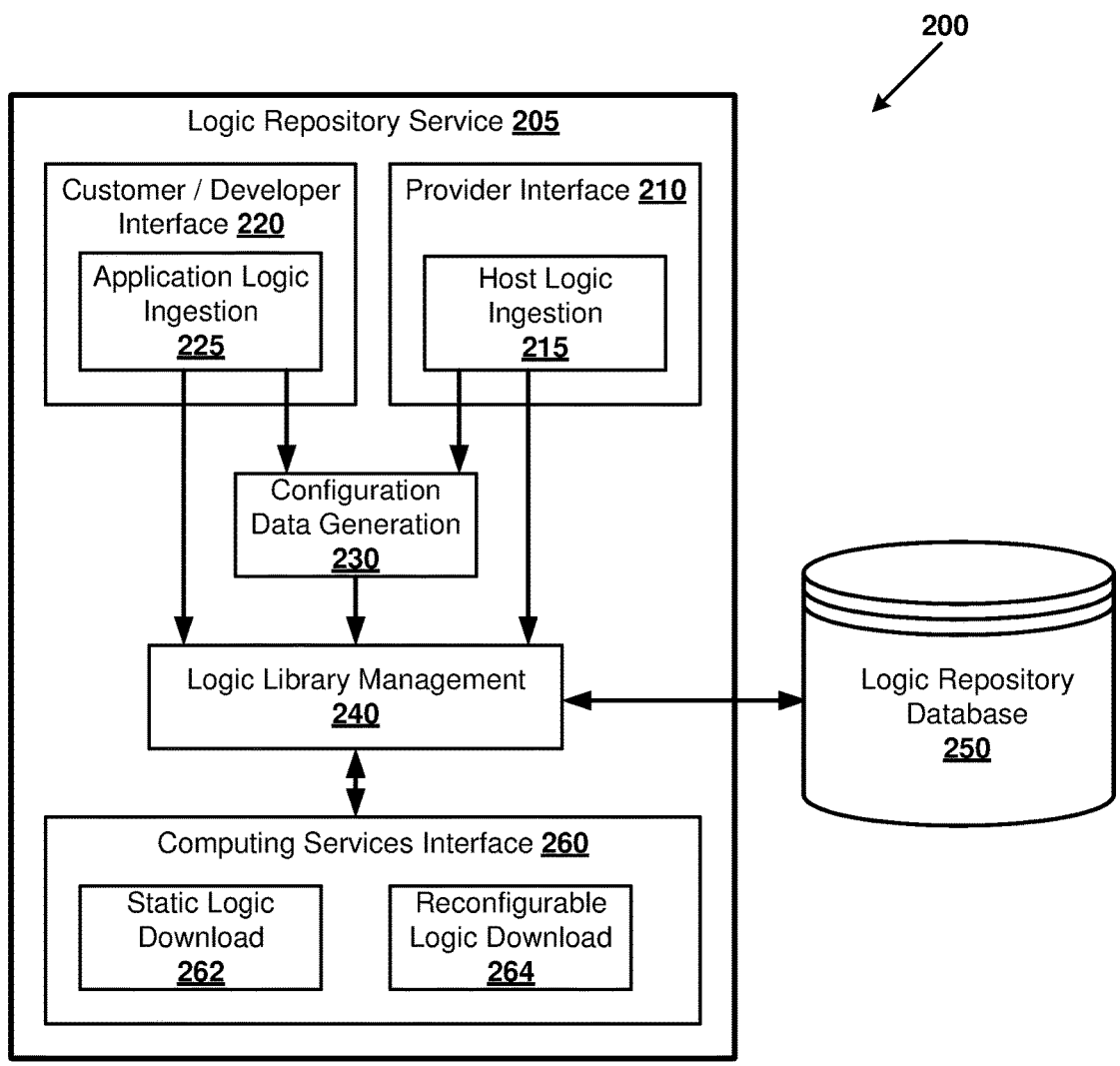
FIG. 2 is a system diagram showing an example architecture of a logic repository service.

FIG. 2 is a system diagram showing an example architecture 200 of a logic repository service 205. The logic repository service 205 can be software executing on a server computer managed by a compute services provider. The logic repository service 205 can be accessed through one or more web APIs.

The logic repository service 205 can include a provider interface 210 for servicing API requests by the compute service provider. The provider interface 210 can be used to authenticate that requests are from agents of the compute service provider, such as by authenticating the identity of the requestor using credentials provided in the request. The provider interface 210 can provide host logic ingestion functionality 215. In particular, the provider interface 210 can receive a request to upload a host logic design to the logic repository service 205 and the request can be processed by the host logic ingestion functionality 215. As described previously, the host logic can include logic for sandboxing the application logic to maintain the security and availability of the computing resources. Additionally, the host logic can be further divided into static logic and reconfigurable logic. The static logic can be configured during an initialization sequence (e.g., at boot time), whereas the reconfigurable logic can be configured at different times during the operation of the configurable logic. As one example, the PCI Express interface can specify that a PCI endpoint be booted and enumerated within about one hundred milliseconds after a reset signal is deasserted. The host logic can be divided into static logic that can be loaded within the allotted time window, and reconfigurable logic that can be loaded after the time window has passed. The static logic can be used as an interface between different reconfigurable regions. The host logic design can be specified using HDL source code, written in, for example, System Verilog, Verilog, or VHDL. The HDL source code can be encrypted or non-encrypted. In some examples, netlists describing logic components can be provided in addition to, or instead of, HDL source code. The host logic ingestion module 215 can be used to perform checks on the received host logic design, decrypt the host logic design, and/or provide versioning information for the host logic design. Additionally, the request can include information for associating the host logic design with one or more instance types. For example, some host logic designs may work only with one subset of instance types and other host logic designs may work only with a different subset of instance types.

The logic repository service 205 can include a customer-developer interface 220 for servicing API requests from the users of the logic repository service 205. The customer-developer interface 220 can be used to authenticate that requests are from users of the compute service provider, such as by authenticating the identity of the requestor using credentials provided in the request. For example, each of the users can be provided with an account that can be used to identify the user for access management, billing, and usage tracking. The users can be limited to viewing and modifying only the logic designs to which they are authorized to access. For example, the users can be prevented from uploading and/or modifying host logic.

The customer-developer interface 220 can include application logic ingestion functionality 225 for receiving and/or processing an application logic design. The application logic design can be specified using source code (e.g., HDL language code, expressed in SystemVerilog, Verilog, C, SystemC, or other suitable description language), a netlist including a list of configurable logic blocks and the connections between the configurable logic blocks, and/or configuration data. For example, the HDL code may describe instantiations of virtual debug units, which will then be stitched into the configuration data by including proprietary netlists not accessible to the engineer developing the source code. As another example, the configuration data can include a full or partial bitstream which has been pre-compiled for at least certain portions before being uploaded to the logic repository service. The application logic will be combined with host logic (such as by a configuration data generation block 230) to create the logic that can be loaded onto a configurable hardware platform. Processing the application logic design can include translating and/or compiling source code to a lower level format (e.g., compiling OpenCL to generate behavioral or structural Verilog), verifying that required logic and/or signals are present (such as interface signals to the host logic), verifying that known restricted circuits are not present (such as ring oscillators), and other various tasks in preparation for generating configuration data.

The customer-developer interface 220 can accept various types of requests from a user. As one example, a user can request to create a configurable hardware image (CHI). A CHI can provide information for configuring an instance of configurable hardware within a computing environment. For example, a CHI can include one or more compatible instance types, the configuration data for configuring the configurable hardware, access permissions for controlling access to the CHI, and any other information associated with configuring the configurable hardware. The request to create the CHI can include fields for a design description or title, a production status of the design, whether or not the design is encrypted, a reference to source code for the design, a type of source code indicator, an instance type or types that are compatible with the configuration data, and a reference to a location to store reporting information.

The configuration data generation block 230 can be used to create configuration data for programming a reconfigurable logic device. For example, the configuration data can be based on an application logic design and a host logic design. As another example, the configuration data can be based on only an application logic design or only a host logic design. In particular, the configuration data generation block 230 can generate static logic based only on the host logic design. Additionally, the configuration data generation block 230 can generate reconfigurable logic for one or more reconfigurable regions of the configurable logic. For example, the configuration data generation block 230 can be used to generate host reconfigurable logic for a region reserved for host functions. As another example, the configuration data generation block 230 can be used to generate application reconfigurable logic for a region reserved primarily for application functions.

Inputs to the configuration data generation block 230 can be an application logic design (such as from the application logic ingestion 225), a host logic design (such as from the host logic ingestion 215), and/or constraints describing various implementation details (such as clock frequencies, partitioning information, placement information, a target technology, and so forth). The logic designs can include source code described using an HDL, a netlist, and/or configuration data. The configuration data generation block 230 can combine an application and a host design into one design to create the configuration data. As described in more detail with reference to FIG. 3, the configuration data generation block 230 can include a logic synthesis tool and a place and route tool. Using these tools, the configuration data generation block 230 can create configuration data for loading on a configurable hardware platform.

The output from the configuration data generation block 230 can be managed using the logic library management block 240. For example, the logic library management block 240 can associate user information with the configuration data and store the information at the logic repository database 250.

The computing services interface 260 can be used as an interface between the logic repository service 205 and computing resources. For example, when an instance is created on the computing resources, an API request can be sent to the computing services interface 260 and configuration data can be downloaded to the requesting resource. The static logic download component 262 can be used to download static logic to the configurable hardware platform on the requesting instance. Additionally, a request can be for reconfigurable logic, and the reconfigurable logic download component 264 can be used to service the request. Specifically, the reconfigurable logic download can retrieve the configuration data through the logic repository database 250 via the logic library management block 240. The request can be for reconfigurable host logic or for reconfigurable application logic.

Figure 3:
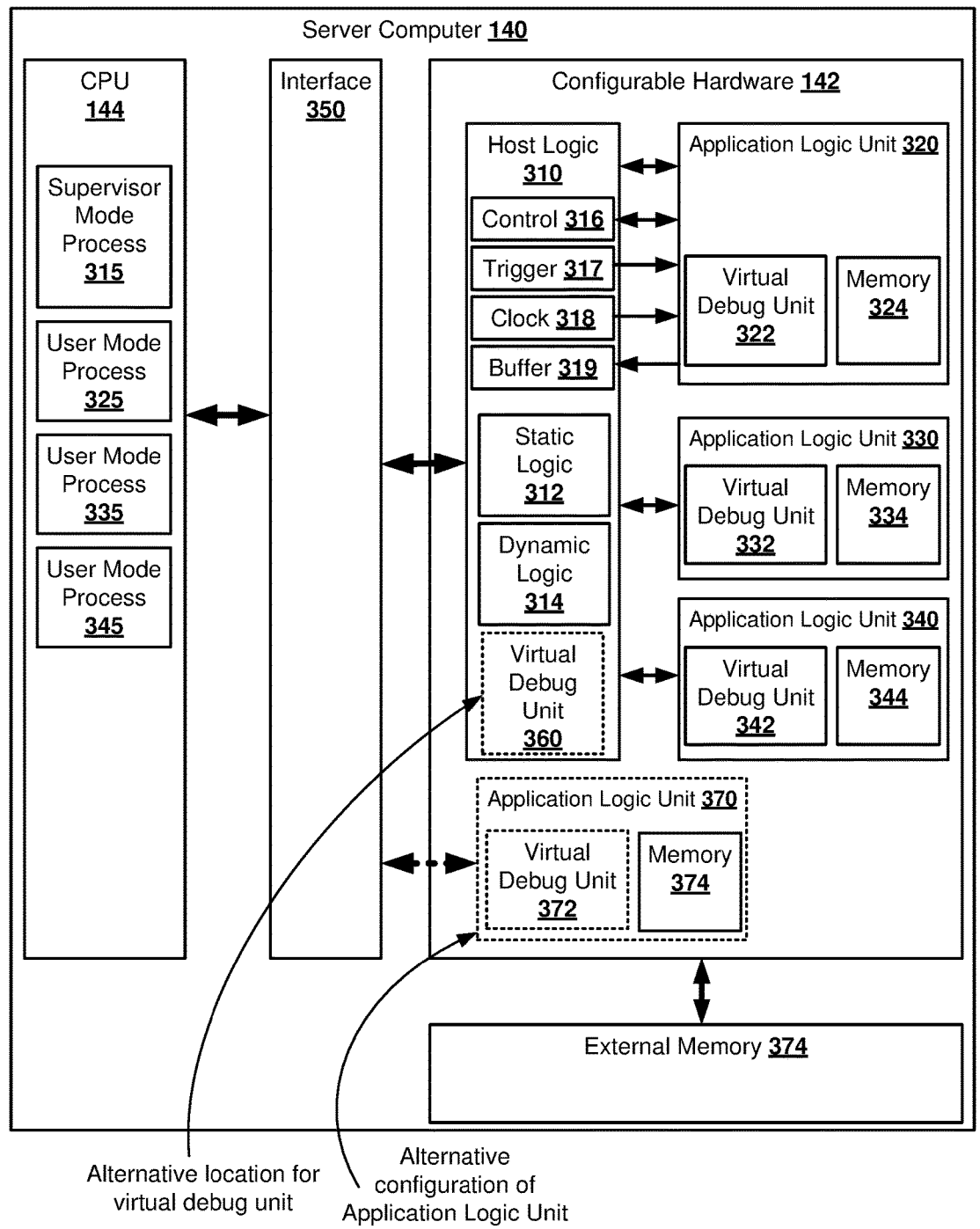
FIG. 3 is a block diagram outlining an example configuration of a system including application logic incorporating virtual debug units, as can be implemented in certain examples of the disclosed technology.

FIG. 3 is a block diagram 300 further detailing an example of the server computer 140, including CPU 144 and configurable hardware 142, as can be used in certain examples of the disclosed technology. As shown, the configurable hardware 142 includes reconfigurable logic devices that have been programmed to implement host logic 310. The host logic 310 includes static logic 312, which is typically reprogrammed infrequently, and dynamic logic 314, which is typically reprogrammed more frequently. For example, the dynamic logic 314 may be reconfigured each time the application logic unit 320 is reprogrammed or modified. The host logic 310 further includes control signal generators 316, which send and receive control signals to and from the application logic unit 320. The host logic 310 further includes trigger generation logic 317 which generates trigger signals that can be used by debug logic in the application logic unit in order to, for example, capture data and other signals for debug on a rising or falling edge of a trigger signal. The host logic 310 further includes a clock generator 318, which generates clock signals used to regulate operation of sequential logic within the application logic unit 320. The host logic 310 further includes buffers 319, such as first in first out (FIFO) buffers, which can receive data from the application logic unit 320 and buffer it until it is sent to the CPU 144 via an interface. Each of the control generator 316, the trigger generator 317, the clock generator 318, and the buffer 319 can be implemented within the static logic 312, the dynamic logic 314, or both the static logic and the dynamic logic.

As shown, the application logic unit 320 is configured to include a virtual debug unit 322. The application logic unit 320 can be used to implement function accelerators, which are reconfigurable hardware that has been configured in order to accelerate calculation of functions specified to be performed by the application logic unit 320. The application logic unit 320 can include a virtual debug unit 322, which is configured to capture specified internal and/or external signals (e.g., generated by combinational or sequential logic), state element values (e.g., stored in flip-flops, latches, or other storage elements), values stored in or output by memories, and other data generated by operation of the application logic unit 320. For example, the virtual debug unit 322 can include logic probes coupled to capture values generated by accelerator logic within the application logic unit 320, logic probes that capture logic values generated by the accelerator logic at time points signaled by one or more triggers created by the trigger generator 317, events counters, which count the number of times an event occurs within an accelerator, energy counters, which count transitions within the accelerator and can be used in order to calculate energy consumption by the application logic unit 320, values generated by scan logic, for example, from chains of instrumented flip-flops or latches within the application logic unit 320, or interrupts generated by setting break point conditions within the application logic unit 320.

Additional examples of components that can be included for the virtual debug unit 322 include inputs for forcing values to be stored in state elements using instrumented flip-flops or latches within a scan chain, circuits for applying a value to a scan cell input, circuits for forcing state elements to a certain logic value, circuits for resetting or setting an event counter to a prescribed value, circuits for setting interrupt break points, or circuits for setting a trigger condition. In some examples, the virtual debug unit 322 includes an array of logic probes coupled to capture logic values generated by accelerator logic within the application logic unit 320. Thus, the array of logic probes forms a "logic analyzer" within the application logic unit. In other examples, the logic analyzer may be formed within the host logic 310. The dynamic logic 314 includes interconnect that is used to connect the host logic 310 to the application logic unit 320. Thus, when a portion of the configurable hardware 142 is reconfigured to change or modify the application logic unit 320, the connection to the host logic 310 can be updated and reconnected by reconfiguring the dynamic logic 314 but not reprogramming any of the static logic 312. Circuitry for the virtual debug units can be contained in the host logic, in the application logic, or formed in portions of both host logic and applications logic.

The application logic unit 320 can also include memory 324. The memory 324 can be implemented in a number of different ways, including with embedded/internal FPGA memory circuits, such as: block RAMs, distributed RAMs, and configuration memory.

The configurable hardware 142 can include a plurality of application logic portions, for example, application logic unit 330, which includes a second virtual debug unit 332 and second memory 334; and application logic unit 340, which includes a third virtual debug unit 342 and third memory 344. Each of the portions of application logic units 320, 330, and 340 communicate with a separate lane or channel of the host logic 310. The host logic 310 or respective virtual debug units can be used to write to or read data from the respective memories 324, 334, and 344 for debugging operations. Further, any of the application logic portions can be reconfigured without adjusting connections to the other application logic portions. For example, the host logic 310 is configured to have an additional set of control generators, trigger generators, clock generators, and buffers for each application logic portion. This allows for any of the application logic portions to be reprogrammed independently of the other application logic portions. For example, if two or more application logic portions are included on a single FPGA integrated circuit, any other portions of the FPGA can be partially reconfigured in order to reprogram only one of the application logic portions selected. In some examples, FPGA portions are selected, based in part on programming granularity and features of the targeted FPGAs. For example, FPGA portions may be created by assigning a range of rows or a range of columns of arrayed logic components in an FPGA to different portions.

The host logic and application logic portions are associated with separate host partitions (e.g., separate processes or virtual machines) executing on the CPU 144. For the example shown in FIG. 3, the host logic 310 is associated with a supervisor mode process 315 executing on the CPU 144. The supervisor mode process 315 executes at a higher level of privilege than other processes of the CPU. For example, an administrator of the server computer 140 may be the only entity with sufficient permissions to use or control the supervisor mode process 315. Each of the application logic units 320, 330, and 340 are associated with a corresponding user mode process 325, 335, and 345, respectively. The user mode processes have a lower permission level than the supervisor mode process 315, and thus other users, in addition to an administrator, can control and use the user mode processes.

The CPU 144 is coupled to the configurable hardware 142 via an interface 350. The interface 350 can be implemented with any suitable interconnect technology, including, but not limited to: PCIe, Ethernet, and Infiniband. Each of the application logic portions uses a different reserve portion of the interface 350 in order to communicate to its associated user mode process. For example, each of the user mode processes may be allowed access to a different range of memory addresses, and the host logic 310 in turn couples each of the individual application logic portions to only the memory address ranges associated with their corresponding process. Thus, the application logic is further independent because data cannot be sent to or from user mode processes other than those user mode processes associated with the application logic unit. Similarly, the supervisor mode process 315 can be coupled to the host logic 310 via another restricted memory range.

As shown in FIG. 3, some of the components may be configured to occupy different portions of the configurable hardware 142 in alternative examples. For example, an alternative configuration of application logic unit 370, including a virtual debug unit 372 and a fourth memory 374 is illustrated using dashed lines. In the illustrated example, the application logic unit 370 is not coupled to the host logic 310, but instead is coupled to its associated user mode process directly via an interconnect interface. For example, the interface 350 can be configured such that the application logic unit portion 370 writes to a specific memory address range, which in turn is associated with a particular user mode process, without communicating via the host logic 310.

Further, memory that may be accessible to the configurable hardware 142 is not limited to the embedded internal memories 324, 334, 344, and 374. For example, an external memory 374, located on a separate integrated circuit die, can be coupled to I/O units of the configurable hard via an I/O interface bus. The host logic 310 can be configured to write to and read from the external memory 374, thereby further enhancing debug visibility. In some examples, separate external memory dies are provided for each of the application logic units, while in other examples, the host logic 310 is configured to maintain separation between application logic units when debugging data values stored in the external memory 374.

In some examples, all or a portion of the debug unit at 360 can be implemented within static or dynamic logic within the host logic 310. For example, input and output signals of the application logic portions can be coupled to the host logic virtual debug unit 360.

In some examples, each of the processes coupled to the host logic 310 and/or the application logic portions are associated with a process that is executed in a different virtual machine hosted by the CPU 144. In other examples, two or more of the processes can execute within the same virtual machine.

Figure 4:
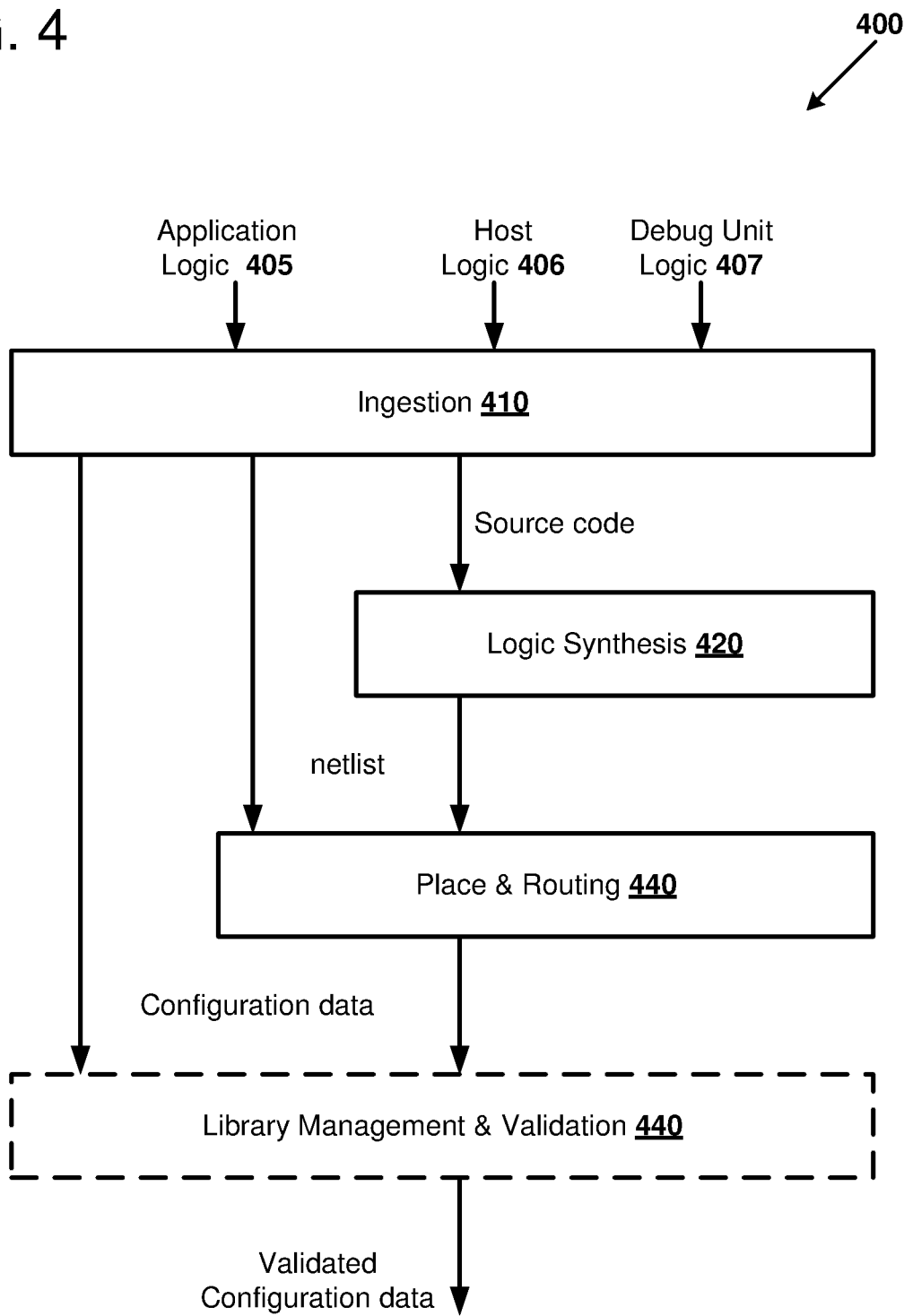
FIG. 4 illustrates an example of ingestion and generation of configuration data as can be performed by a logic repository service.

FIG. 4 illustrates an example flow 400 of ingesting logic designs and producing configuration data as can be performed by a logic repository service. During ingestion 410, descriptions of application logic 405, host logic 406, and/or debug unit logic 407 can be received by a logic repository service. In some examples, the application logic 405 instantiates one or more instances of cells for the debug unit logic 407, and debug circuits are accordingly incorporated into the application logic. In some examples, a description of desired debug data for the application logic 405 is provided (e.g., a list of cells, instances, signals, variables; a description of counters, or other suitable description) and a debug circuit is incorporated into the application logic to generate the desired debug data. The logic design can be encrypted, such as by using the IEEE 1735-2014 encryption standard. The logic design can be decrypted during ingestion 410 or during a later step of the flow 400.

As one example, source code for the application logic 405 and debug unit logic 407 can be received during the ingestion 410 and the application logic and the debug unit logic can be combined into a design to produce source code for logic synthesis 420 for programming a first portion of a reconfigurable logic device. Source code for the host logic 406 can be used to produce source code for logic synthesis 420 for programming a second portion of the reconfigurable logic device. The logic synthesis 420 can be used to transform a specification written in behavioral and/or structural RTL into a netlist based on a target technology. For example, the logic synthesis 420 can target different configurable logic technologies, such as FPGAs having different architectures, manufacturing processes, capacities, and/or manufacturers. The netlist can include a number of configurable logic blocks, non-configurable blocks (e.g., hard or soft macros), and the connections between the different blocks. The netlist can be a logical netlist where blocks of the netlist are enumerated but unplaced within the target technology. The netlist can be used as input to place and route 430. The place and route 430 can take the instances of the configurable blocks from the netlist and the routing information, and map the blocks to a physical, reconfigurable logic device. The place-and-routed design can include a physical mapping for each of the logical components of the netlist. Additionally or alternatively, the place and route 430 can be timing driven so that the netlist is modified based on timing constraints of the design and the physical constraints of the physical device. The output of the place and route 430 can be configuration data, such as a bitstream image. The configuration data can be partitioned or divided into different components. For example, the configuration data can include data associated with static host logic (e.g., static logic 312), reconfigurable host logic (e.g., dynamically reconfigurable logic 314), and/or reconfigurable application logic (e.g., application logic unit 320). The different components can be overlapping or non-overlapping. For example, the static host logic can be routed through regions that are used by the reconfigurable application logic. Thus, a partial bitstream for the reconfigurable application logic can also include portions of the static host logic.

As another example, a netlist for the application logic and/or the host logic can be received during the ingestion 410. As a specific example, a netlist can be received for the application logic and source code can be received for the host logic. In this case, the host logic can be synthesized with the logic synthesis 420 to generate a netlist for the host logic, and the netlists for the host and application logic can be combined into a single design to produce a netlist for the place and route 430. As another example, configuration data for the application logic and/or the host logic can be received during the ingestion 410. For example, a partial bitstream for the application logic design can be received, or a full bitstream for the host and application logic design can be received.

As another example, a timing report can provide a static timing analysis showing whether the design meets timing specifications of the configurable hardware. The logic synthesis 420 and the place and route 430 can involve random, non-deterministic steps that vary with each run of the tools so that each run of the logic synthesis 420 and the place and route 430 may provide different results. Thus, if a developer has a design that does not meet timing (as indicated by the timing report), the developer may desire to rerun the logic synthesis 420 and/or the place and route 430. In this manner, the developer can iterate on their design by executing multiple synthesis and routing runs for the same design.

The library management and validation 440 functionality can be used to validate the user designs for the configurable logic at various points during the development and deployment steps. As one example, the validation 440 can include performing simulations to verify whether the application logic is compatible with the host logic so that the host logic can constrain the functionality of the application logic. The validation 440 can include comparing a netlist of the application logic and confirming that the application logic meets capacity and area restraints of the configurable hardware platform. For example, the application logic can be restricted to use only logic within one or more reconfigurable regions. If the application logic is outside of those regions, then the application logic can be rejected. Additionally, the application logic can be ingested as a bitstream, and the bitstream can be validated by the validation 440. The validation of a bitstream can include comparing a portion of the ingested bitstream data corresponding to the host logic to a baseline version of the host logic to confirm that the host logic is not corrupted. The output from the validation 440 can be validated configuration data.

Figure 5:
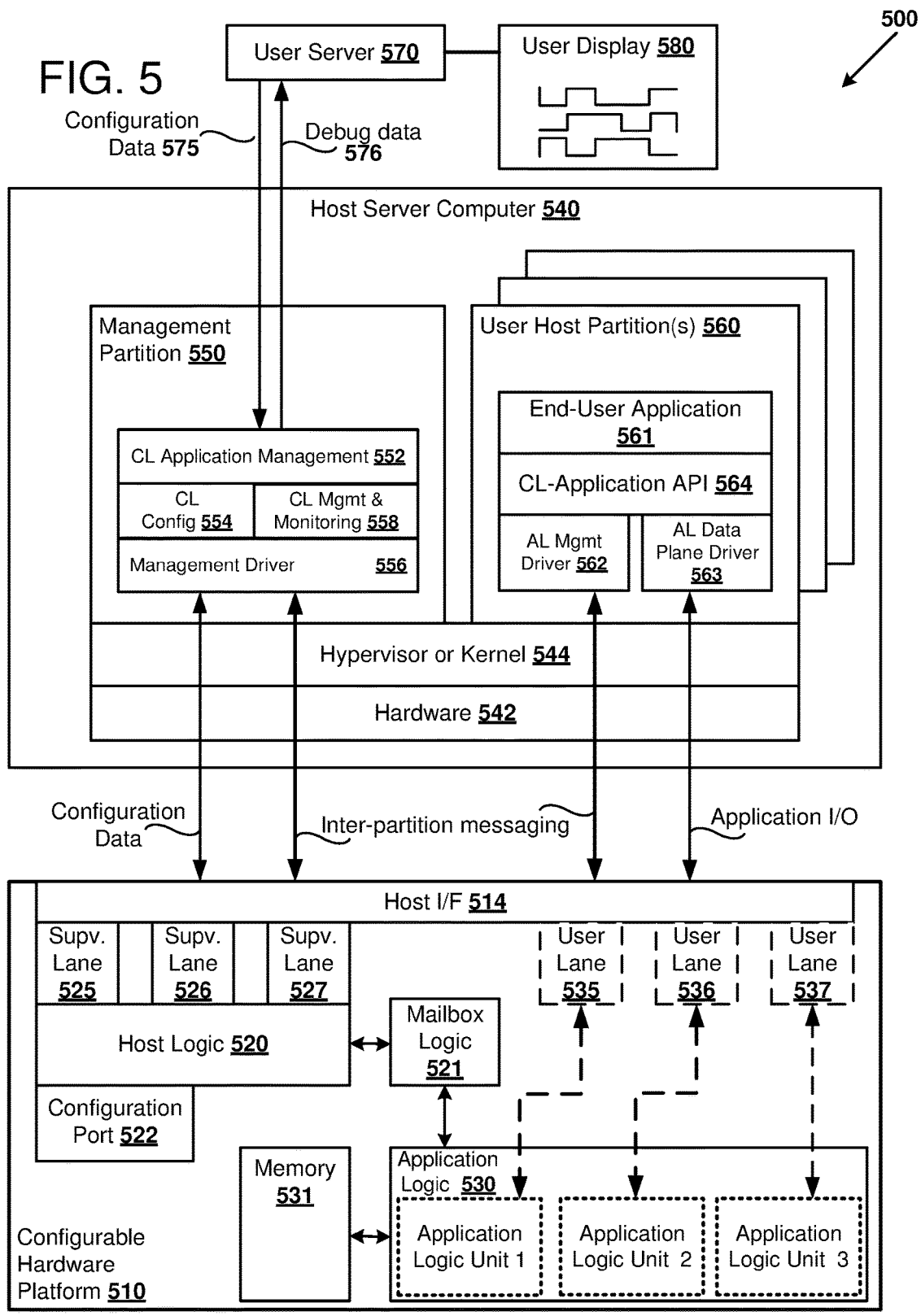
FIG. 5 shows further details of the example system of FIG. 4 including components of a control plane and a data plane for configuring and interfacing to a configurable hardware platform.

FIG. 5 shows further details of an example system 500 including components of a control plane and a data plane for configuring and interfacing to a configurable hardware platform 510. The control plane includes functions for initializing, monitoring, reconfiguring, and tearing down the configurable hardware platform 510. The data plane includes functions for communicating between a user's application and the configurable hardware platform 510. The control plane can be accessible by users or services having a higher privilege level and the data plane can be accessible by users or services having a lower privilege level. In one example, the configurable hardware platform 510 is connected to a server computer 540 using a local interconnect, such as PCIe. In some examples, a different interconnect, such as Ethernet or Infiniband are used. In an alternative example, the configurable hardware platform 510 can be integrated within the hardware of the server computer 540. As one example, the server computer 540 can be one of the plurality of server computers 802A-802C of the compute service provider 800 of FIG. 8.

The host server computer 540 has underlying hardware 542 including one or more CPUs, memory, storage devices, interconnection hardware, etc. Running a layer above the hardware 542 is a hypervisor or kernel layer 544. The hypervisor or kernel layer can be classified as a type 1 or type 2 hypervisor. A type 1 hypervisor runs directly on the host hardware 542 to control the hardware and to manage the guest operating systems. A type 2 hypervisor runs within a conventional operating system environment. Thus, in a type 2 environment, the hypervisor can be a distinct layer running above the operating system and the operating system interacts with the system hardware. Different types of hypervisors include Xen-based, Hyper-V, ESXi/ESX, Linux, etc., but other hypervisors can be used. A management partition 550 (such as Domain 0 of the Xen hypervisor) can be part of the hypervisor or separated therefrom and generally includes device drivers needed for accessing the hardware 542. User host partitions 560 are logical units of isolation within the hypervisor. Each user partition 560 can be allocated its own portion of the hardware layer's memory, CPU allocation, storage, interconnect bandwidth, etc. Additionally, each user partition 560 can include a virtual machine and its own guest operating system. As such, each user partition 560 is an abstract portion of capacity designed to support its own virtual machine independent of the other partitions. The user host partitions 560 execute at a lower level of privilege than the management partition 550 (such as Domain U of the Xen hypervisor).

The management partition 550 can be used to perform management services for the user host partitions 560 and the configurable hardware platform 510. The management partition 550 can communicate with web services (such as a deployment service, a logic repository service, and a health monitoring service) of the compute service provider, the user host partitions 560, and the configurable hardware platform 510. The management services can include services for launching and terminating user host partitions 560, and configuring, reconfiguring, and tearing down the configurable logic of the configurable hardware platform 510. As a specific example, the management partition 550 can launch a new user partition 560 in response to a request from a deployment service (such as the deployment component 826 of FIG. 8). The request can include a reference to an MI and/or a CHI. The MI can specify programs and drivers to load on the user partition 560 and the CHI can specify configuration data to load on the configurable hardware platform 510. The management partition 550 can initialize the user partition 560 based on the information associated with the MI and can cause the configuration data associated with the CHI to be loaded onto the configurable hardware platform 510. The initialization of the user partition 560 and the configurable hardware platform 510 can occur concurrently so that the time to make the instance operational can be reduced.

The management partition 550 can be used to manage programming and monitoring of the configurable hardware platform 510. The management partition 550 can also be used to send and receive debug data to and from the configurable hardware platform 510. By using the management partition 550 for these purposes, access to the configuration data and the configuration ports of the configurable hardware platform 510 can be restricted. Specifically, users with lower privilege levels can be restricted from directly accessing the management partition 550. Further, users with lower privilege levels can be restricted from accessing other user host partitions. Thus, the configurable logic cannot be modified without using the infrastructure of the compute services provider and any third party IP used to program the configurable logic can be protected from viewing by unauthorized users. Further, unauthorized users are also prevented from sending debug data to, or receiving any debug data from, unauthorized partitions on the configurable hardware platform 510.

The management partition 550 can include a software stack for the control plane to configure and interface to a configurable hardware platform 510. The control plane software stack can include a configurable logic (CL) application management layer 552 for communicating with web services (such as a logic repository service or a health monitoring service), the configurable hardware platform 510, and the user host partitions 560. For example, the CL application management layer 552 can issue a request to fetch configuration data in response to a user partition 560 being launched. The CL application management layer 552 can communicate with the user partition 560 using shared memory of the hardware 542 or by sending and receiving inter-partition messages over the interconnect connecting the server computer 540 to the configurable hardware platform 510. Specifically, the CL application management layer 552 can read and write messages to mailbox logic 521 of the configurable hardware platform 510. The messages can include requests by an end-user application 561 to reconfigure or tear-down the configurable hardware platform 510. The CL application management layer 552 can issue a request to a logic repository service to fetch configuration data in response to a request to reconfigure the configurable hardware platform 510. The CL application management layer 552 can initiate a tear-down sequence in response to a request to tear down the configurable hardware platform 510. The CL application management layer 552 can perform watchdog related activities to determine whether the communication path to the user partition 560 is functional.

The control plane software stack can include a CL configuration layer 554 for accessing the configuration port 522 (e.g., a configuration access port) of the configurable hardware platform 510 so that configuration data can be loaded onto the configurable hardware platform 510. For example, the CL configuration layer 554 can send a command or commands to the configuration port 522 to perform a full or partial configuration of the configurable hardware platform 510. The CL configuration layer 554 can send the configuration data (e.g., a bitstream) to the configuration port 522 so that the configurable logic can be programmed according to the configuration data. The configuration data can specify host logic and/or application logic.

The control plane software stack can include a management driver 556 for communicating over the physical interconnect connecting the server computer 540 to the configurable hardware platform 510. The management driver 556 can encapsulate commands, requests, responses, messages, and data originating from the management partition 550 for transmission over the physical interconnect. Additionally, the management driver 556 can de-encapsulate commands, requests, responses, messages, and data sent to the management partition 550 over the physical interconnect. Specifically, the management driver 556 can communicate with the host logic 520 of the configurable hardware platform 510 via one or more of the supervisor lanes 525-527. For example, the supervisor lanes can access a physical or virtual function mapped to an address range during an enumeration of devices connected to the physical interconnect. The management driver 556 can communicate with the host logic 520 by addressing transactions to the address range assigned to one or more of the supervisor lanes 525-527.

The control plane software stack can include a CL management and monitoring layer 558. The CL management and monitoring layer 558 can monitor and analyze transactions occurring on the physical interconnect to determine a health of the configurable hardware platform 510 and/or to determine usage characteristics of the configurable hardware platform 510. For example, the CL management and monitoring layer 558 can monitor whether configuration data is successfully deployed on the configurable hardware platform 510 and can cause a report to be transmitted to the logic repository service indicating the status of the deployment.

A user server 570 can be used to send configuration data 575 to the management partition 550. The configuration data 575 can be validated and then used to program a portion (e.g., one or more configurable logic partitions) of application logic 530. The user server 570 can also send commands to the management partition to initiate operation of the programmed partitions. As execution proceeds, debug data 576 is received and can be displayed on a user display 580 coupled to the user serve 570. For example, timing waveforms showing changes in signal values within the configurable logic partitions can be displayed and analyzed to determine possible locations for bugs, errata, and other points of interest. In some alternative examples, the user server 570 communicates with one of the user host partitions in order to send debug data to, and receive debug data from, the configurable logic partitions.

In some examples, access to the configurable hardware platform 510 is allocated such that the management partition 550 or one of the user host partitions 560 hosts one or more supervisor processes, and the host logic 520 is only accessible from the supervisor process and the application logic 530 is accessible from user processes executing within the same partition. The supervisor process is configured to operate at higher level of privilege than the user processes. In other examples, access to the configurable hardware platform 510 is allocated such that the management partition 550 executes a supervisor process and user processes are executed by one or more of the user host partitions 560. In some examples, each of the user processes executes in a different virtual machine executed by a different one of the user host partitions 560.

The configurable hardware platform 510 can include non-configurable hard macros and configurable logic. The hard macros can perform specific functions within the configurable hardware platform 510, such as input/output blocks (e.g., serializer and deserializer (SERDES) blocks and gigabit transceivers), analog-to-digital converters, memory control blocks, test access ports, and a configuration port 522. The configurable logic can be programmed or configured by loading configuration data onto the configurable hardware platform 510. For example, the configuration port 522 can be used for loading the configuration data. As one example, configuration data can be stored in a memory (such as a Flash memory) accessible by the configuration port 522 and the configuration data can be automatically loaded during an initialization sequence (such as during a power-on sequence) of the configurable hardware platform 510. Additionally, the configuration port 522 can be accessed using an off-chip processor or an interface within the configurable hardware platform 510.

The configurable logic can be programmed to include host logic 520 and application logic 530. The host logic 520 can shield the interfaces of at least some of the hard macros from the end-users so that the end-users have limited access to the hard macros and to the physical interconnect. For example, the host logic can restrict access of the user host partitions 560 to only access their associated configurable logic partition(s) (e.g., access to only one of application logic unit 1, application logic unit 2, or application logic unit 3) within the application logic 530. In a PCIe context, this can be implemented by assigning different user host partitions to different memory address ranges by configuring the base address registers (BARs) to reserve certain memory address ranges for certain combinations of host partitions and configurable logic partitions.

The application logic 530 can include both hard macros and configurable logic. The application logic 530 can be partitioned into two or more portions, and each of the portions can be assigned to one or more of the user host partitions. Each of the configurable logic partitions are excluded from accessing other partitions of the configurable hardware platform by the host logic 520, which manages partitioning of the application logic 530 resources, and communications between the application logic 530 and user host partitions 560. As shown, the host logic 520 allocates a number of different lanes of interconnect supervisor lanes 525-527. In a PCIe context, each of the lanes can be associated with a user host partition/configurable logic partition pair.

The host logic 520 can further be coupled to the mailbox logic 521, the configuration port 522, the host interface 514, and the application logic 530. The end-users can cause the user-configurable application logic 530 to be loaded on the configurable hardware platform 510, and can communicate with the configurable application logic 530 from the user host partitions 560 (via one of the user lanes 535-537).

The host interface logic 514 can include circuitry (e.g., hard macros and/or configurable logic) for signaling on the physical interconnect and implementing a communications protocol. The communications protocol specifies the rules and message formats for communicating over the interconnect.

In alternative examples, the partitions within the application logic 530 are configured to communicate their respective associated user host partitions 560 without communicating through the host logic 520. In such examples, the user configurable logic partitions are coupled to a respective one of the user host partitions via one of the user lanes 535-537. Each of the user lanes is configured to transmit data between the host partitions and the configurable logic partitions. For example, in a PCIe context, each lane is associated with a different memory address range.

In addition to embedded/internal memories within the application logic 530, a separate memory 531 can be coupled to the application logic 530. The memory 531, which may be located on a separate integrated circuit die, can be coupled to I/O units of the application logic 530 via an I/O interface bus. The host logic 520 can be configured to write to and read from the external memory 531, thereby further enhancing debug visibility.

The application logic 530 can be used to communicate with drivers of the user host partitions 560. In, for example, a PCIe context, user lanes 535-537 can be implemented as a physical or virtual function mapped to an address range during an enumeration of devices connected to the physical interconnect. The application drivers can communicate with the application logic 530 by addressing transactions to the address range assigned to a certain one of the user lanes 535-537. Specifically, the application logic 530 can communicate with an application logic management driver 562 to exchange commands, requests, responses, messages, and data over the control plane. The application logic 530 can communicate with an application logic data plane driver 563 to exchange commands, requests, responses, messages, and data over the data plane.

In some examples, one configurable logic partition of the application logic 530 is configured to communicate to one user host partition 560 using a single lane. In some examples, one configurable logic partition of the application logic 530 is configured to communicate to two or more host partitions (e.g., processes or virtual machines) using a single lane, or using a lane for each host partition. In some examples, one host partition is configured to communicate to a plurality of two or more configurable logic partitions, each using a separate lane.

The mailbox logic 521 can include one or more buffers and one or more control registers. For example, a given control register can be associated with a particular buffer and the register can be used as a semaphore to synchronize between the management partition 550 and the user partition 560. As a specific example, if a partition can modify a value of the control register, the partition can write to the buffer. The buffer and the control register are accessible from the host logic 520. In alternative examples, buffer and the control register are accessible from both the host logic 520 and the application logic 530. When the message is written to the buffer, another control register (e.g., the message ready register) can be written to indicate the message is complete. The message ready register can polled by the partitions to determine if a message is present, or an interrupt can be generated and transmitted to the partitions in response to the message ready register being written.

The user partition 560 can include a software stack for interfacing an end-user application 560 to the configurable hardware platform 510. The application software stack can include functions for communicating with the control plane and the data plane. Specifically, the application software stack can include a CL-Application API 564 for providing the end-user application 560 with access to the configurable hardware platform 510. The CL-Application API 564 can include a library of methods or functions for communicating with the configurable hardware platform 510 and the management partition 550. For example, the end-user application 561 can send a command or data to the configurable application logic 530 by using an API of the CL-Application API 564. In particular, the API of the CL-Application API 564 can interface with the application logic (AL) data plane driver 563 which can generate a transaction targeted to the application logic 530 which can communicate with the targeted partition. In this manner, the end-user application 561 can cause the configurable application logic 530 to receive, process, and/or respond with data to potentially accelerate tasks of the end-user application 561. As another example, the end-user application 561 can send a command or data to the management partition 550 by using an API of the CL-Application API 564. In particular, the API of the CL-Application API 564 can interface with the AL management driver 562 which can generate a transaction targeted to the application logic 530 which can communicate with the mailbox logic 521. In this manner, the end-user application 561 can cause the management partition 550 to provide operational or metadata about the configurable hardware platform 510 and/or to request that the configurable application logic 530 be reconfigured.

The application software stack in conjunction with the hypervisor or kernel 544 can be used to limit the operations available to perform over the physical interconnect by the end-user application 561. For example, the compute services provider can provide the AL management driver 562, the AL data plane driver 563, and the CL-Application API 564 (such as by associating the files with a machine image). These components can be protected from modification by only permitting users and services having a higher privilege level than the end-user to write to the files. The AL management driver 562 and the AL data plane driver 563 can be restricted to using only addresses within the address range of one of the associated user lanes 535-537. Additionally, an input/output memory management unit (I/O MMU) can restrict interconnect transactions to be within the address ranges of the supervisory lanes 525-527 and/or the user lanes 535-537.

Figure 6:
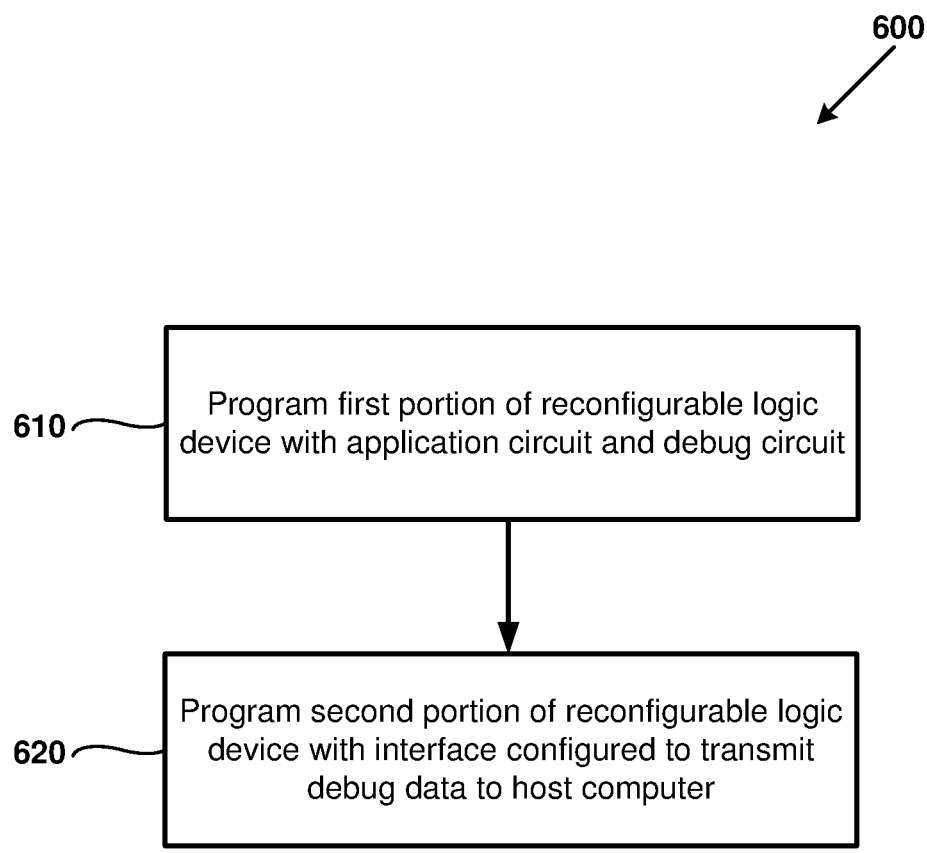
FIG. 6 is a flow chart outlining an example method of programming a reconfigurable logic device to transmit debug data to a host computer, as can be performed in certain examples of the disclosed technology.

FIG. 6 is a flowchart 600 outlining and example method of programming a reconfigurable logic device, as can be performed in certain examples of the disclosed technology. For example, systems such as those described in FIGS. 1,3, and 5 can be used to implement the illustrated method.

At process block 610, a first portion of a reconfigurable logic device is programmed with a circuit including an application circuit and a debug circuit. The debug circuit is coupled to the application circuit and is configured to capture debug data generated by exercising logic within the application circuit. For example, a debug circuit can be coupled to the application circuit by reprogramming interconnect resources within an FPGA integrated circuit.

At process block 620, a second portion of the reconfigurable logic device is programmed to have an interface to a host computer coupled to the FPGA integrated circuit. The interface is configured to transmit debug data from the application circuit to the host computer. The interface can be further configured to transmit debug data from the host computer to the debug circuit. For example, the interface can be configured to override or set signals within the application circuit as instructed by a process executing on the host computer. In some examples, the debug circuit includes a logic analyzer that is configured to capture signal values when exercising the application circuit according to one or more clock signals and one or more trigger signals. For example, a selection of data signals generated by the application circuit can be all captured at the same time, for example on a rising or falling trigger or clock edge.

Figure 7:
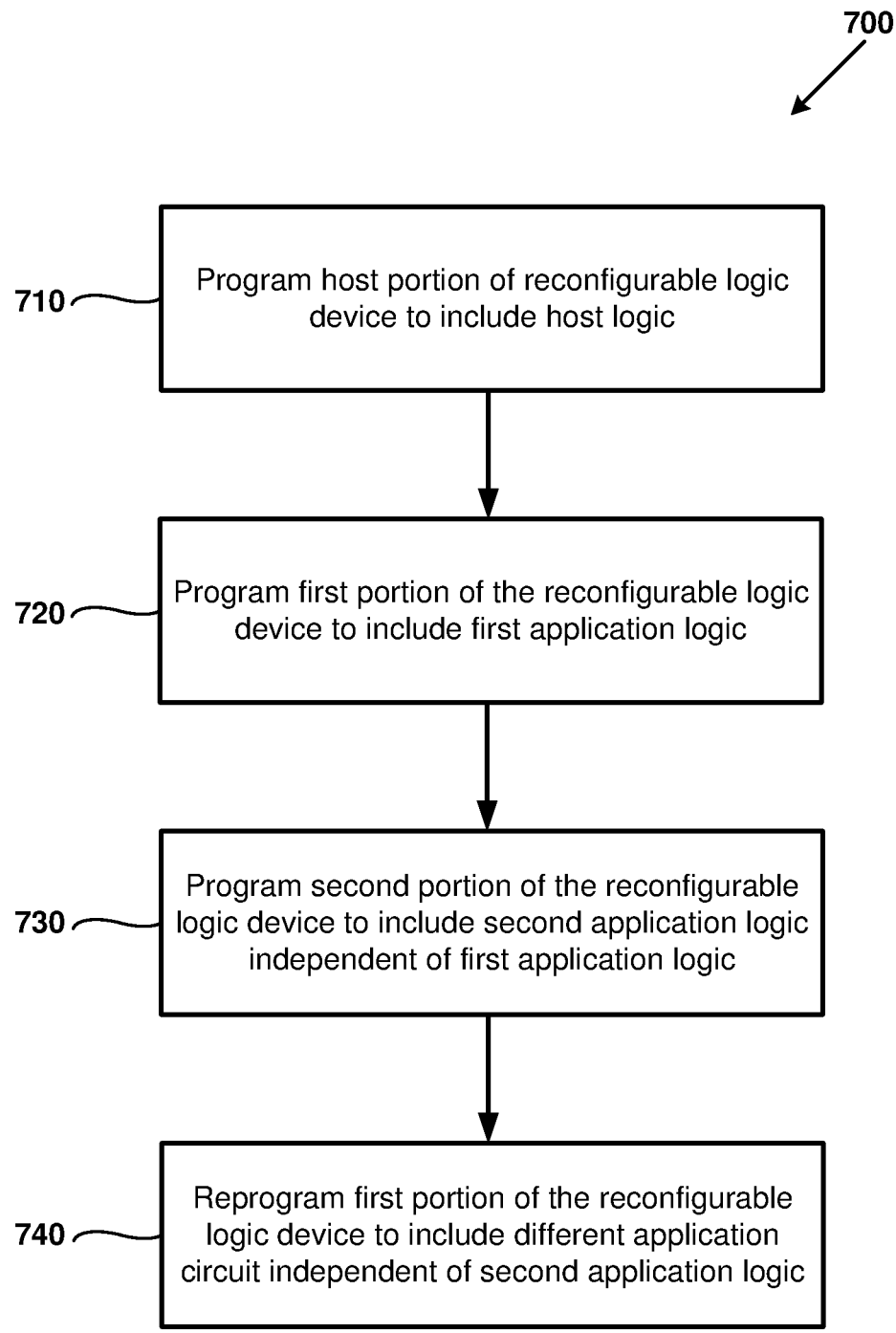
FIG. 7 is a flow chart outlining an example method of reprogramming a portion of a reconfigurable logic device independently of another portion of the reconfigurable logic device, as can be performed in certain examples of the disclosed technology.

FIG. 7 is a flowchart 700 outlining an example method of capturing debug data from an FPGA and a multi-tenant server environment as can be performed in certain examples of the disclosed technology. For example, host computers coupled to reconfigurable logic devices, such as those described above regarding FIGS. 1, 3, and/or 5 can be used to perform the illustrated method.

At process block 710, a host portion of a programmable logic device is programmed to include host logic for controlling the operation of two or more application logic partitions comprising accelerator logic. For example, the host logic 310 discussed above can be programmed within a host logic portion of an FPGA. In some examples, logic is synthesized or generated and converted into a netlist, which is then used to generate configuration information for programming a portion of an FPGA integrated circuit. In some examples, the FPGA is designed to support reprogramming of a portion, but not all, of the FPGA's reconfigurable logic device resources. Thus, the amount of time required to program the FPGA is reduced, as only a portion of the FPGA is configured to implement the host logic portions or the application logic portions. In other examples, all or at least a portion of the host logic is built into the FPGA or other reconfigurable logic device employed to supervise application logic portions.

At process block 720, a first (user) portion of a programmable logic device is programmed with a circuit comprising an application circuit, such as an accelerator, and a corresponding virtual debug unit. The virtual debug unit is coupled to logic within the accelerator in order to capture debug data generated by exercising the application's circuit.

At process block 730, a second (user) portion of a programmable logic device is programmed to comprise a second application circuit and a corresponding debug circuit. The second debug circuit can similarly be configured to capture debug generated by exercising the second application circuit.

At process block 740, the first or second user portion of the programmable logic device are reprogrammed with a different second circuit comprising a second application circuit and a second debug circuit. The interface of the first portion can be configured to transmit debug data from the debug circuit to the host computer without reprogramming the second portion of the programmable logic device. Thus, the first portion comprising the application circuit can be reprogrammed independently of the second portion comprising an application circuit.

In some examples of the illustrated method the debug circuit for any one of the application circuit portions can be generated by receiving a user description of an application circuit including an instantiation of the debug circuit and synthesizing logic for the application circuit and the debug circuit where the synthesized logic is used to configure the first portion of the programmable logic device. In some examples, the logic for the application circuit is synthesized and includes instantiated circuits for the debug circuit. In some examples of the disclosed technology, the debug circuit can be generated by receiving a user description of the application circuit and an indication of debug data to extract from the application circuit.

The method further comprises generating logic for the debug circuit including circuits to extract the indicated debug data. For example, a list of cell names, instance names, signals, and/or variables can be received and used to generate a debug circuit that includes logic to extract the indicated debug data. For example, flip-flops can be added to capture signals from a list of signals based on a rising or falling edge of a trigger or clock circuit. In some examples, the debug circuit, such as a debug circuit within a virtual debug unit can be reconfigured to capture different debug data without reprogramming the application logic portion. In some examples, the debug circuit can be reconfigured to capture different debug data by reprogramming only the debug circuit portion of the virtual debug unit. In some examples, a host computer is configured to execute processes having a high privileged level and a low privilege level. Programming of the first portion of logic to provide the user application logic is initiated by a process executed on the host in the low privilege level and logic in the second portion, for example, the host logic 310 is initiated by a process executing on the host at a high privilege level.

Figure 8:
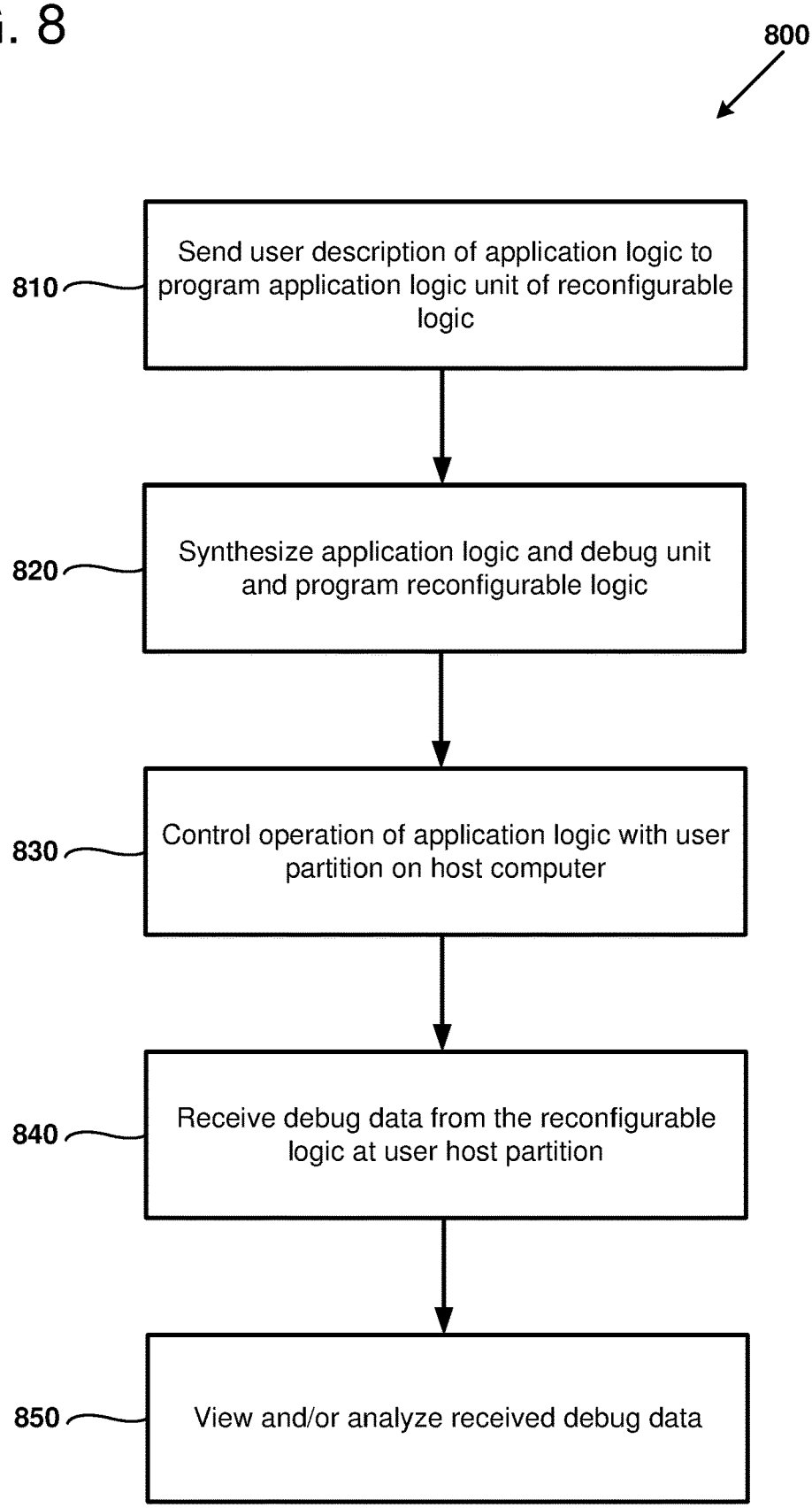
FIG. 8 is a flow chart outlining an example method of debugging an application circuit in a reconfigurable logic device from a computing host, as can be performed in certain examples of the disclosed technology.

FIG. 8 is a flowchart 800 outlining an example method of debugging an application circuit as can be performed in certain examples of the disclosed technology.

At process block 810, a user description of application logic is sent to a reconfigurable logic device comprising a host logic portion and an application logic portion. The reconfigurable logic devices are configured so that only user processes associated with a particular portion of application logic can access debug data for the application logic circuit. For example, the application logic can be assigned to a specified communication lane or channel by a privileged, host logic portion in order to enforce separation between application logic partitions.

At process block 820, application logic is synthesized to include a debug unit and the reconfigurable logic devices programmed with the synthesized application logic and the debug unit. For example, a description of the debug unit can be synthesized along with the application logic in order to include the debug unit. In other examples, the application logic instantiates cells describing the debug unit. In other examples, the debug unit is at least partially included in the host logic portion.

At process block 830, the user partition on the host computer is used to control operation of the application logic on the reconfigurable logic device. For example, the user partition can start and stop operations performed by the application logic by turning on or off clocks or other control signals to start and stop exercising of the circuit.

At process block 840, debug data is received from the reconfigurable logic at a user partition of the host computer. In some examples, the debug data is sent directly by a communication channel configured to send data only to the user host partition. In other examples, a host portion of the reconfigurable logic device supervises and controls how data is sent from the particular application logic portion to a user host partition on the host computer. Standard or proprietary formats can be used for sending the data to the host via a stream or via files, including FSDB or VCD files, which describe changes in waveform values generated by the application logic as captured by the debug data.

At process block 850, a user can view and/or analyze received debug data using suitable applications executed on the host computer. For example, a waveform viewer, simulator, or other suitable tool can be used to view and analyze the received debug data. In some examples, the host portion of the programmable logic device includes a logic analyzer configured to receive debug data from the application portion of the programmable logic device. In some examples, the debug data is first received with a supervisor level process executing on the host computer and at least a portion of the debug data is sent from the supervisory level process to a user level process executed on the host computer. The supervisor level process ensures that the debug data is only sent to an authorized user level process. In some examples, actions performed at process block 850 include analyzing signal waveforms, counter values, or trigger data generated by the debug circuit. In some examples, the method further includes transmitting debug data to the debug circuit in order to change state values in the application circuit. For example, state elements such as registers or flip-flops can have their state value changed by forcing values using the debug circuit.

Figure 9:
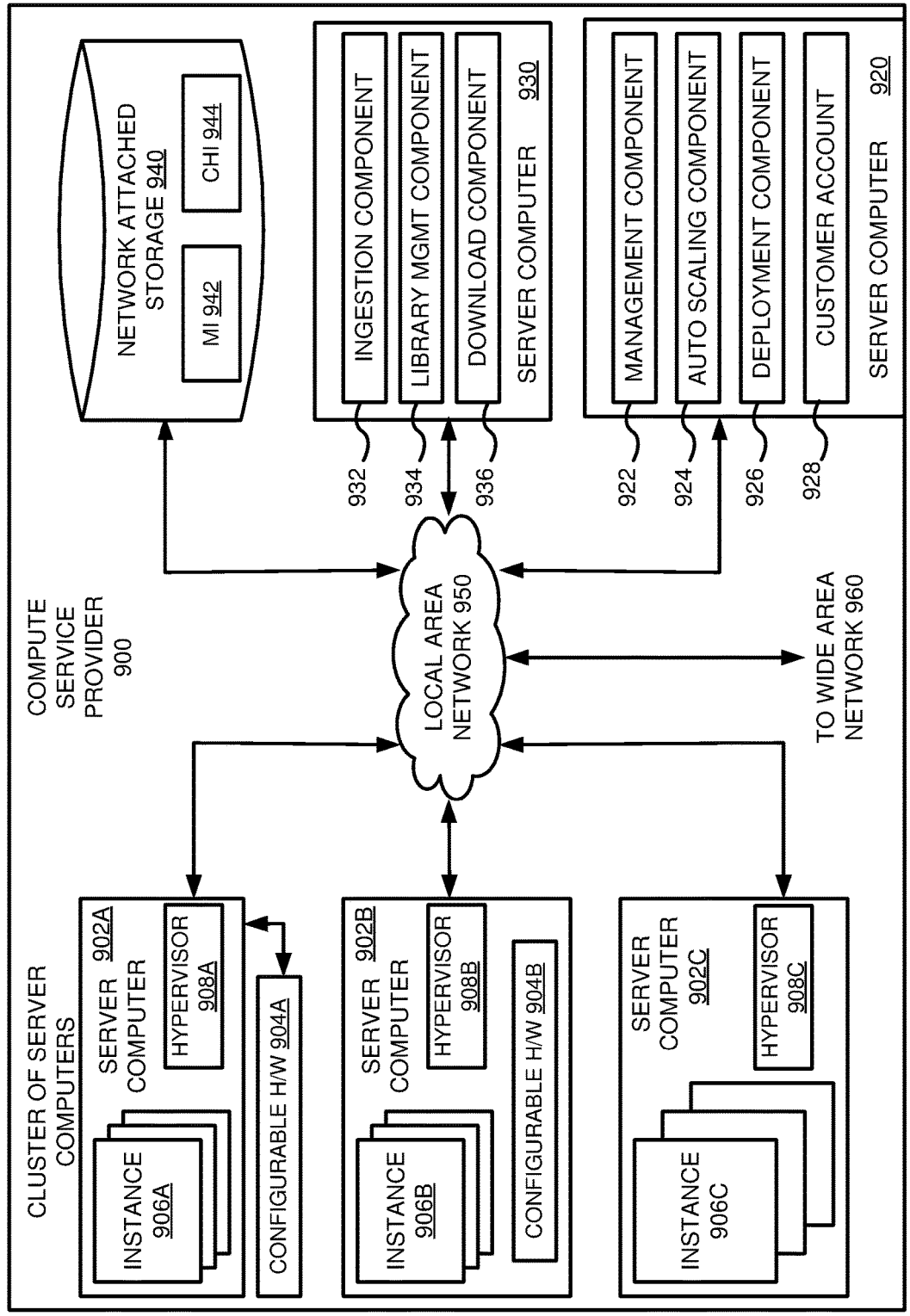
FIG. 9 is an example system diagram showing a plurality of virtual machine instances running in a multi-tenant environment including a logic repository service.

FIG. 9 is a computing system diagram of a network-based compute service provider 900 that illustrates one environment in which examples described herein can be used. By way of background, the compute service provider 900 (e.g., a cloud services provider) is capable of delivery of computing and storage capacity as a service to a community of end recipients. In some examples, the compute service provider can be established for an organization by or on behalf of the organization. That is, the compute service provider 900 may offer a "private cloud environment." In another example, the compute service provider 900 supports a multi-tenant environment, wherein a plurality of customers operate independently (e.g., a public cloud environment). Generally speaking, the compute service provider 900 can provide the following models: Infrastructure as a Service ("IaaS"), Platform as a Service ("PaaS"), and/or Software as a Service ("SaaS"). Other models can be provided. For the IaaS model, the compute service provider 900 can offer computers as physical or virtual machines and other resources. The virtual machines can be run as guests by a hypervisor, as described further below. The PaaS model delivers a computing platform that can include an operating system, programming language execution environment, database, and web server. Application developers can develop and run their software solutions on the compute service provider platform without the cost of buying and managing the underlying hardware and software. Additionally, application developers can develop and run their hardware solutions on configurable hardware of the compute service provider platform. The SaaS model allows installation and operation of application software in the compute service provider. In some examples, end users access the compute service provider 900 using networked client devices, such as desktop computers, laptops, tablets, smartphones, etc. running web browsers or other lightweight client applications. Those skilled in the art will recognize that the compute service provider 900 can be described as a "cloud" environment.

The particular illustrated compute service provider 900 includes a plurality of server computers 902A-902C. While only three server computers are shown, any number can be used, and large centers can include thousands of server computers. The server computers 902A-902C can provide computing resources for executing software instances 906A-906C. In one example, the software instances 906A-906C are virtual machines. As known in the art, a virtual machine is an instance of a software implementation of a machine (i.e. a computer) that executes applications like a physical machine. In the example of a virtual machine, each of the servers 902A-902C can be configured to execute a hypervisor 908 or another type of program configured to enable the execution of multiple software instances 906 on a single server. Additionally, each of the software instances 906 can be configured to execute one or more applications.

It should be appreciated that although the examples disclosed herein are described primarily in the context of virtual machines, other types of instances can be utilized with the concepts and technologies disclosed herein. For instance, the technologies disclosed herein can be utilized with storage resources, data communications resources, and with other types of computing resources. The examples disclosed herein might also execute all or a portion of an application directly on a computer system without utilizing virtual machine instances.

The server computers 902A-902C can include a heterogeneous collection of different hardware resources or instance types. Some of the hardware instance types can include configurable hardware that is at least partially configurable by a user of the compute service provider 900. One example of an instance type can include the server computer 902A which is in communication with configurable hardware 904A. Specifically, the server computer 902A and the configurable hardware 904A can communicate over a local interconnect such as PCIe. Another example of an instance type can include the server computer 902B and configurable hardware 904B. For example, the configurable logic 904B can be integrated within a multi-chip module or on the same die as a CPU of the server computer 902B. Yet another example of an instance type can include the server computer 902C without any configurable hardware. Thus, hardware instance types with and without configurable logic can be present within the resources of the compute service provider 900.

One or more server computers 920 can be reserved for executing software components for managing the operation of the server computers 902 and the software instances 906. For example, the server computer 920 can execute a management component 922. A customer can access the management component 922 to configure various aspects of the operation of the software instances 906 purchased by the customer. For example, the customer can purchase, rent or lease instances and make changes to the configuration of the software instances. The configuration information for each of the software instances can be stored as a machine image (MI) 942 on the network-attached storage 940. Specifically, the MI 942 describes the information used to launch a VM instance. The MI can include a template for a root volume of the instance (e.g., an OS and applications), launch permissions for controlling which customer accounts can use the MI, and a block device mapping which specifies volumes to attach to the instance when the instance is launched. The MI can also include a reference to a configurable hardware image (CHI) 944 which is to be loaded on configurable hardware 904 when the instance is launched. The CHI includes configuration data for programming or configuring at least a portion of the configurable hardware 904.

The customer can also specify settings regarding how the purchased instances are to be scaled in response to demand. The management component can further include a policy document to implement customer policies. An auto scaling component 924 can scale the instances 906 based upon rules defined by the customer. In one example, the auto scaling component 924 allows a customer to specify scale-up rules for use in determining when new instances should be instantiated and scale-down rules for use in determining when existing instances should be terminated. The auto scaling component 924 can consist of a number of subcomponents executing on different server computers 902 or other computing devices. The auto scaling component 924 can monitor available computing resources over an internal management network and modify resources available based on need.

A deployment component 926 can be used to assist customers in the deployment of new instances 906 of computing resources. The deployment component can have access to account information associated with the instances, such as who is the owner of the account, credit card information, country of the owner, etc. The deployment component 926 can receive a configuration from a customer that includes data describing how new instances 906 should be configured. For example, the configuration can specify one or more applications to be installed in new instances 906, provide scripts and/or other types of code to be executed for configuring new instances 906, provide cache logic specifying how an application cache should be prepared, and other types of information. The deployment component 926 can utilize the customer-provided configuration and cache logic to configure, prime, and launch new instances 906. The configuration, cache logic, and other information may be specified by a customer using the management component 922 or by providing this information directly to the deployment component 926. The instance manager can be considered part of the deployment component.

Customer account information 928 can include any desired information associated with a customer of the multi-tenant environment. For example, the customer account information can include a unique identifier for a customer, a customer address, billing information, licensing information, customization parameters for launching instances, scheduling information, auto-scaling parameters, previous IP addresses used to access the account, a listing of the MI's and CHI's accessible to the customer, etc.

One or more server computers 930 can be reserved for executing software components for managing the download of configuration data to configurable hardware 904 of the server computers 902. For example, the server computer 930 can execute a logic repository service comprising an ingestion component 932, a library management component 934, and a download component 936. The ingestion component 932 can receive host logic and application logic designs or specifications and generate configuration data that can be used to configure the configurable hardware 904. The library management component 934 can be used to manage source code, user information, and configuration data associated with the logic repository service. For example, the library management component 934 can be used to store configuration data generated from a user's design in a location specified by the user on the network-attached storage 940. In particular, the configuration data can be stored within a configurable hardware image 944 on the network-attached storage 940. Additionally, the library management component 934 can manage the versioning and storage of input files (such as the specifications for the application logic and the host logic) and metadata about the logic designs and/or the users of the logic repository service. The library management component 934 can index the generated configuration data by one or more properties such as a user identifier, an instance type, a marketplace identifier, a machine image identifier, and a configurable hardware identifier, for example. The download component 936 can be used to authenticate requests for configuration data and to transmit the configuration data to the requestor when the request is authenticated. For example, agents on the server computers 902A-B can send requests to the download component 936 when the instances 906 are launched that use the configurable hardware 904. As another example, the agents on the server computers 902A-B can send requests to the download component 936 when the instances 906 request that the configurable hardware 904 be partially reconfigured while the configurable hardware 904 is in operation.

The network-attached storage (NAS) 940 can be used to provide storage space and access to files stored on the NAS 940. For example, the NAS 940 can include one or more server computers used for processing requests using a network file sharing protocol, such as Network File System (NFS). The NAS 940 can include removable or non-removable media, including magnetic disks, storage area networks (SANs), redundant arrays of independent disks (RAID), magnetic tapes or cassettes, CD-ROMs, DVDs, or any other medium which can be used to store information in a non-transitory way and which can be accessed over the network 950.

The network 950 can be utilized to interconnect the server computers 902A-902C, the server computers 920 and 930, and the storage 940. The network 950 can be a local area network (LAN) and can be connected to a Wide Area Network (WAN) 960 so that end users can access the compute service provider 900. It should be appreciated that the network topology illustrated in FIG. 9 has been simplified and that many more networks and networking devices can be utilized to interconnect the various computing systems disclosed herein.

Figure 10:
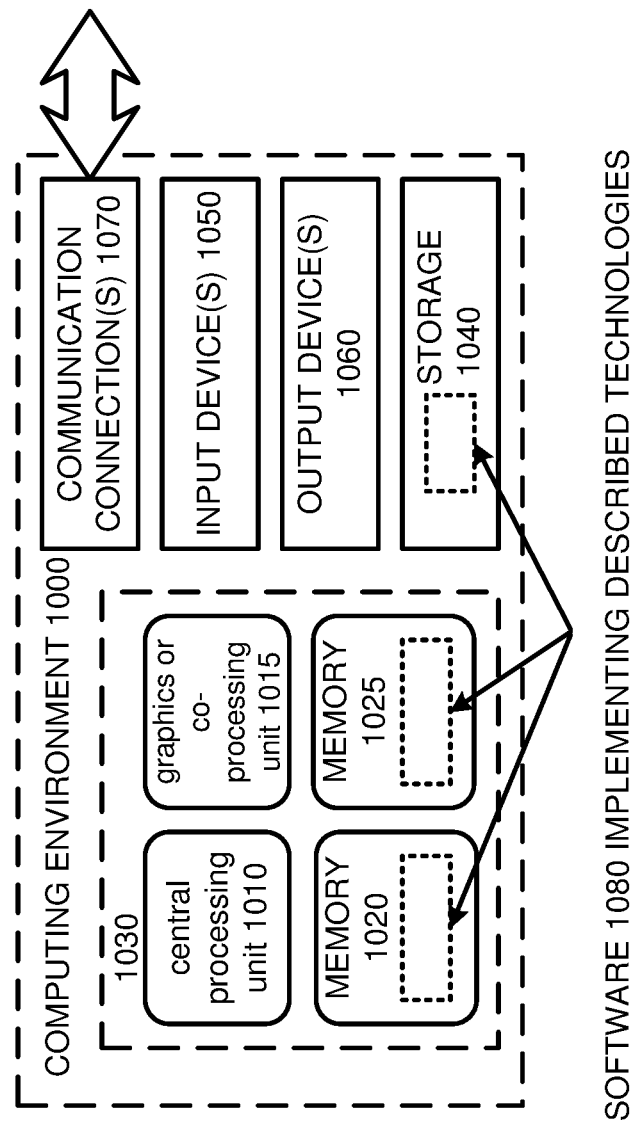
FIG. 10 depicts a generalized example of a suitable computing environment in which certain described innovations may be implemented.

FIG. 10 depicts a generalized example of a suitable computing environment 1000 in which the described innovations may be implemented. The computing environment 1000 is not intended to suggest any limitation as to scope of use or functionality, as the innovations may be implemented in diverse general-purpose or special-purpose computing systems. For example, the computing environment 1000 can be any of a variety of computing devices (e.g., desktop computer, laptop computer, server computer, tablet computer, etc.)

With reference to FIG. 10, the computing environment 1000 includes one or more processing units 1010, 1015 and memory 1020, 1025. In FIG. 10, this basic configuration 1030 is included within a dashed line. The processing units 1010, 1015 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 10 shows a central processing unit 1010 as well as a graphics processing unit or co-processing unit 1015. The tangible memory 1020, 1025 may be volatile memory (e.g., registers, cache, RAM), non-volatile memory (e.g., ROM, EEPROM, flash memory, etc.), or some combination of the two, accessible by the processing unit(s). The memory 1020, 1025 stores software 1080 implementing one or more innovations described herein, in the form of computer-executable instructions suitable for execution by the processing unit(s).

A computing system may have additional features. For example, the computing environment 1000 includes storage 1040, one or more input devices 1050, one or more output devices 1060, and one or more communication connections 1070. An interconnection mechanism (not shown) such as a bus, controller, or network interconnects the components of the computing environment 1000. Typically, operating system software (not shown) provides an operating environment for other software executing in the computing environment 1000, and coordinates activities of the components of the computing environment 1000.

The tangible storage 1040 may be removable or non-removable, and includes magnetic disks, magnetic tapes or cassettes, CD-ROMs, DVDs, or any other medium which can be used to store information in a non-transitory way and which can be accessed within the computing environment 1000. The storage 1040 stores instructions for the software 1080 implementing one or more innovations described herein.

The input device(s) 1050 may be a touch input device such as a keyboard, mouse, pen, or trackball, a voice input device, a scanning device, or another device that provides input to the computing environment 1000. The output device(s) 1060 may be a display, printer, speaker, CD-writer, or another device that provides output from the computing environment 1000.

The communication connection(s) 1070 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed examples can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Furthermore, any of the software-based examples (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed examples, alone and in various combinations and subcombinations with one another. The disclosed methods, apparatus, and systems are not limited to any specific aspect or feature or combination thereof, nor do the disclosed examples require that any one or more specific advantages be present or problems be solved.

In view of the many possible examples to which the principles of the disclosed technology may be applied, it should be recognized that the illustrated examples are only preferred examples and should not be taken as limiting the scope of the claims to those preferred examples. Rather, the scope of the claimed subject matter is defined by the following claims. We therefore claim as our invention all that comes within the scope of these claims.

What is claimed is:

1. A system, comprising:
a host computing device executing two or more user partitions at a first privilege level and executing a privileged host partition at a second privilege level greater than the first privilege level, wherein the first privilege level allows access to at least one of the two or more user partitions and restricts access to the privileged host partition, and the second privilege level allows access to the privileged host partition; and
a reconfigurable logic device having reconfigurable logic programmed to include two or more application logic units, each of the application logic units associated with one of the user partitions and being configured to communicate debug data generated by operating the application logic unit via a different communication lane to the associated user partition.

2. The system of claim 1, wherein the reconfigurable logic device further comprises host logic to supervise operation of the application logic units, the host logic being controlled by the host partition.

3. The system of claim 2, wherein the application logic units communicate to the host computing device via a network interface not supervised by the host logic.

4. The system of claim 2, wherein the application logic units communicate to the host computing device via an independent communication channel provided by the host logic.

5. The system of claim 2, wherein, the host logic transmits debug data for two or more of the application logic units via a supervisor privilege communication channel.

6. The system of claim 2, wherein at least one of the application logic units further comprises a logic analyzer configured to generate signal values of the debug data by sampling logic signals within the at least one application logic unit.

7. The system of claim 2, wherein, the host logic allows debug data generated by one of the application logic units from being accessed by other user partitions on the host computing device.

8. The system of claim 1, wherein each of the user partitions executes in a different virtual machine of the host computing device.

9. The system of claim 1, wherein the debug data includes one or more of the following: signal values, values stored in a memory in the reconfigurable logic device, values stored in a memory coupled to the reconfigurable logic device, event counter values, or trigger values.

10. The system of claim 1, wherein the debug data are generated by one or more of the following components configured in the reconfigurable logic device: logic probes coupled to capture values generated by accelerator logic, logic probes that capture values generated by accelerator logic with use of a trigger, event counters, energy counters, scan out values, or interrupts generated by setting breakpoints, embedded FPGA memories, or memory devices coupled to the reconfigurable logic device.

11. The system of claim 1, wherein the reconfigurable device further comprises circuitry configured to modify signal values in the application logic unit with one or more of the following components: a scan cell input, forcing a state element value, resetting or setting an event counter to a prescribed value, or setting an interrupt breakpoint.

12. A method, comprising:
with a host computing device, executing a privileged host partition at a first privilege level and one or more user partitions at a second privilege level less than the first privilege level, wherein the first privilege level allows access to the privileged host partition, and the second privilege level allows access to at least one of the one or more user partitions and restricts access to the privileged host partition; and
with a reconfigurable logic device having reconfigurable logic programmed to include one or more application logic units, communicating debug data generated by operating one of the application logic units via an assigned communication lane to an assigned user partition of the user partitions.

13. The method of claim 12, further comprising supervising the application logic units with host logic programmed on the reconfigurable logic device, the host logic being controlled by the host partition.

14. The method of claim 13, further comprising, with the application logic units, communicating to the host computing device via a network interface not supervised by the host logic.

15. The method of claim 13, further comprising, with the application logic units, communicating to the host computing device via an independent communication channel provided by the host logic.

16. The method of claim 13, further comprising, with the host logic, transmitting debug data for two or more of the application logic units via a supervisor privilege communication channel.

17. The method of claim 13, further comprising, with a logic analyzer configured in the application logic units, generating signal values of the debug data by sampling logic signals within the at least one application logic unit.

18. The method of claim 13, further comprising, by the host logic, preventing debug data generated by one of the application logic units from being accessed by other user partitions on the host computing device.

19. The method of claim 12, wherein each of the user partitions executes in a different virtual machine of the host computing device.

20. The method of claim 12, wherein the debug data includes one or more of the following: signal values, values stored in a memory in the reconfigurable logic device, values stored in a memory coupled to the reconfigurable logic device, event counter values, or trigger values.

21. The method of claim 12, wherein the debug data are generated by one or more of the following components configured in the reconfigurable logic device: logic probes coupled to capture values generated by accelerator logic, logic probes that capture values generated by accelerator logic with use of a trigger, event counters, energy counters, scan out values, or interrupts generated by setting breakpoints, embedded FPGA memories, or memory devices coupled to the reconfigurable logic device.

22. The method of claim 12, wherein the reconfigurable device further comprises circuitry configured to modify signal values in the application logic unit with one or more of the following components: a scan cell input, forcing a state element value, resetting or setting an event counter to a prescribed value, or setting an interrupt breakpoint.

23. One or more computer-readable storage devices or memory storing configuration data for programming a configuration memory in a field programmable gate array (FPGA) coupled to a host computing device executing a privileged host partition and one or more user partitions, the privileged host partition executing at a greater level of privilege than the user partitions, wherein the greater level of privilege allows access to the privileged host partition and the user partitions are restricted from accessing the privileged host partition, the FPGA when so programmed performing a method, the method comprising:
  with one or more application logic units programmed in the FPGA, communicating debug data generated by operating one of the application logic units via an assigned communication lane to a different one of the user partitions executing on the host computing device.

24. The computer-readable storage devices or memory of claim 23, wherein the method further comprises supervising operation of the application logic units with host logic programmed on the reconfigurable logic device, the host logic being controlled by the host partition.

25. The computer-readable storage devices or memory of claim 23, wherein the configuration data further comprises data for configuring a logic analyzer in at least one of the application logic units, the logic analyzer generating signal values of the debug data by sampling logic signals within the at least one application logic unit.

26. The computer-readable storage devices or memory of claim 23, wherein the configuration data further comprises host logic preventing debug data generated by one of the application logic units from being accessed by other user partitions on the host computing device.

27. The computer-readable storage devices or memory of claim 23, wherein the debug data are generated by one or more of the following components configured in the reconfigurable logic device: logic probes coupled to capture values generated by accelerator logic, logic probes that capture values generated by accelerator logic with use of a trigger, event counters, energy counters, scan out values, or interrupts generated by setting breakpoints, embedded FPGA memories, or memory devices coupled to the reconfigurable logic device.

\* \* \* \* \*